US008772857B2

(12) United States Patent
Choe et al.

(10) Patent No.: US 8,772,857 B2
(45) Date of Patent: Jul. 8, 2014

(54) VERTICAL MEMORY DEVICES AND METHODS OF MANUFACTURING THE SAME

(75) Inventors: Byeong-In Choe, Yongin-si (KR); Jae-Hoon Jang, Seongnam-si (KR); Sun-Il Shim, Songpa-gu (KR); Han-Soo Kim, Suwon-si (KR); Jin-Man Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 87 days.

(21) Appl. No.: 13/221,380

(22) Filed: Aug. 30, 2011

(65) Prior Publication Data
US 2012/0098048 A1    Apr. 26, 2012

(30) Foreign Application Priority Data
Oct. 21, 2010  (KR) .......................... 10-2010-0102715

(51) Int. Cl.
*H01L 29/788*    (2006.01)

(52) U.S. Cl.
USPC ........ 257/319; 257/315; 257/322; 257/E29.3; 257/E29.301

(58) Field of Classification Search
USPC .............. 257/319, 315, 322, E29.3, E29.301
See application file for complete search history.

(56) References Cited

U.S. PATENT DOCUMENTS

2009/0294828 A1* 12/2009 Ozawa et al. ................. 257/319
2010/0078701 A1*  4/2010 Shim et al. .................... 257/314

* cited by examiner

*Primary Examiner* — Minchul Yang
(74) *Attorney, Agent, or Firm* — Harness, Dickey & Pierce, P.L.C.

(57) ABSTRACT

A vertical memory device includes a channel, a ground selection line (GSL), word lines and a string selection line (SSL). The channel extends in a first direction substantially perpendicular to a top surface of a substrate, and a thickness of the channel is different according to height. The GSL, the word lines and the SSL are sequentially formed on a sidewall of the channel in the first direction and spaced apart from each other.

19 Claims, 41 Drawing Sheets

VERTICAL MEMORY DEVICES AND METHODS OF MANUFACTURING THE SAME

CROSS-REFERENCE TO RELATED APPLICATION

This application claims priority under 35 USC §119 to Korean Patent Application No. 10-2010-0102715 filed on Oct. 21, 2010, in the Korean Intellectual Property Office (KIPO), the entire contents of which is incorporated herein by reference.

BACKGROUND

1. Field

Example embodiments relate to vertical memory devices and methods of manufacturing the same.

2. Description of the Related Art

Vertical memory devices increase integration density in comparison to planar devices. In a method of manufacturing a vertical memory device, after alternately depositing a plurality of memory cells and insulation layers, the memory cells and the insulation layers are etched to form an opening. Polysilicon is deposited in the opening to form a channel. The channel may be formed to have a cup shape or a hollow cylindrical shape so that the channel may be thin.

SUMMARY

Example embodiments may provide vertical memory devices with good and/or improved characteristics. Example embodiments may provide methods of manufacturing vertical memory devices with good and/or improved characteristics.

According to example embodiments, there is provided a vertical memory device. The device includes a channel, a ground selection line (GSL), word lines and a string selection line (SSL). The channel extends in a first direction substantially perpendicular to a top surface of a substrate, and has different thicknesses according to height. The GSL, the word lines and the SSL are sequentially formed on a sidewall of the channel in the first direction and spaced apart from each other.

According to at least one example embodiment, a vertical memory device includes a channel extending in a first direction substantially perpendicular to a top surface of a substrate, a thickness of the channel varying according to height, and at least one ground selection line (GSL), a plurality of word lines and at least one string selection line (SSL) spaced apart from each other on a sidewall of the channel in the first direction.

According to example embodiments, the channel may include a lower portion and an upper portion. The lower portion may have a first thickness and the upper portion may have a second thickness less than the first thickness. According to example embodiments, the lower portion may be formed at a position lower than the SSL. According to example embodiments, the channel may include a lower portion, a central portion and an upper portion. The lower may have a first thickness, the upper portion may have a third thickness, and the central portion may have a second thickness greater than the first and third thicknesses. According to example embodiments, the central portion may be formed at a position lower than the SSL and higher than the GSL.

According to example embodiments, the vertical memory device may further include a dummy word line on a sidewall of the channel between the word lines. The channel may include a lower portion having a first thickness, a first central portion having a second thickness, a second central portion having a third thickness, and an upper portion having a fourth thickness. The second and fourth thicknesses may be less than the first and third thicknesses.

According to example embodiments, the first central portion may be adjacent to the dummy word line, and the upper portion may be adjacent to the SSL. According to example embodiments, the vertical memory device may further include a dummy word line on a sidewall of the channel between the word lines. The channel may include a lower portion having a first thickness, a first central portion having a second thickness, a second central portion having a third thickness, a third central portion having a fourth thickness, and an upper portion having a fifth thickness. The first, third and fifth thicknesses may be less than the second and fourth thicknesses. According to example embodiments, the lower portion may be adjacent to the GSL, the second central portion may be adjacent to the dummy word line, and the upper portion may be adjacent to the SSL.

According to example embodiments, a plurality of channels each of which may have a cup shape may be formed in a second direction substantially parallel to the top surface of the substrate. According to example embodiments, a plurality of channels each of which may have a linear shape extending in the first direction may be formed in a second direction substantially parallel to the top surface of the substrate. According to example embodiments, the vertical memory device may further include a tunnel insulation layer pattern, a charge trapping layer pattern and a blocking layer pattern sequentially stacked in a third direction substantially perpendicular to the sidewall of the channel between each of the GSL, the word lines and the SSL and the sidewall of the channel.

According to example embodiments, the vertical memory device may further include a common source line (CSL) and a bit line. The CSL may be at an upper portion of the substrate and extend in a second direction substantially perpendicular to the third direction. The bit line may be electrically connected to the channel and extend in the third direction. According to example embodiments, there is provided a method of manufacturing a vertical memory device. In the method, a channel is formed on a substrate to extend in a first direction substantially perpendicular to a top surface of the substrate. The channel has different thicknesses according to height. A GSL, word lines and an SSL may be formed on a sidewall of the channel in the first direction. The GSL, the word lines and the SSL may be spaced apart from each other.

According to at least one example embodiment, a method of manufacturing a vertical memory device includes forming a channel with a thickness varying according to height on a substrate, the channel extending in a first direction substantially perpendicular to a top surface of the substrate, and forming at least one ground selection line (GSL), a plurality of word lines and at least one string selection line (SSL) spaced apart on a sidewall of the channel in the first direction.

According to example embodiments, the channel may be formed to include a lower portion having a first thickness and an upper portion having a second thickness smaller than the first thickness. The lower portion may be formed at a position lower than the SSL. According to example embodiments, the channel may have a relatively thick thickness at a portion adjacent to the word line and a relatively thin thickness at a portion adjacent to the SSL and/or the GSL so that the vertical memory device including the channel may have good threshold voltage and switching characteristics and good endurance.

According to at least one example embodiment, a vertical memory device includes a ground selection line (GSL), a word line (WL) on the GSL, a string selection line (SSL) on the WL, and a channel of varying thickness crossing the GSL, WL and SSL.

BRIEF DESCRIPTION OF THE DRAWINGS

Example embodiments will be more clearly understood from the following detailed description taken in conjunction with the accompanying drawings. FIGS. 1A-39 represent non-limiting, example embodiments as described herein.

FIGS. 1A, 1B and 1C are a perspective diagram, a local perspective diagram and a cross-sectional view, respectively, illustrating vertical memory devices in accordance with example embodiments;

FIGS. 2-13 are cross-sectional diagrams illustrating methods of manufacturing a vertical memory device of FIG. 1 in accordance with example embodiments;

FIG. 14 is a cross-sectional diagram illustrating vertical memory devices in accordance with other example embodiments;

FIGS. 15-21 are cross-sectional diagrams illustrating methods of manufacturing a vertical memory device of FIG. 14 in accordance with example embodiments;

FIG. 22 is a cross-sectional diagram illustrating vertical memory devices in accordance with still other example embodiments;

FIG. 23 is a cross-sectional diagram illustrating vertical memory devices in accordance with yet other example embodiments;

FIGS. 25-34 are perspective diagrams illustrating methods of manufacturing a vertical memory device of FIG. 24 in accordance with example embodiments;

FIG. 35 is a perspective diagram illustrating vertical memory devices in accordance with still further example embodiments;

FIG. 36 is a perspective diagram illustrating vertical memory devices in accordance with even further example embodiments;

FIG. 37 is a perspective diagram illustrating vertical memory devices in accordance with yet further example embodiments;

FIG. 38 is a schematic diagram illustrating memory cards according to example embodiments; and FIG. 39 is a block diagram illustrating electronic systems according to example embodiments.

Figure 1A:
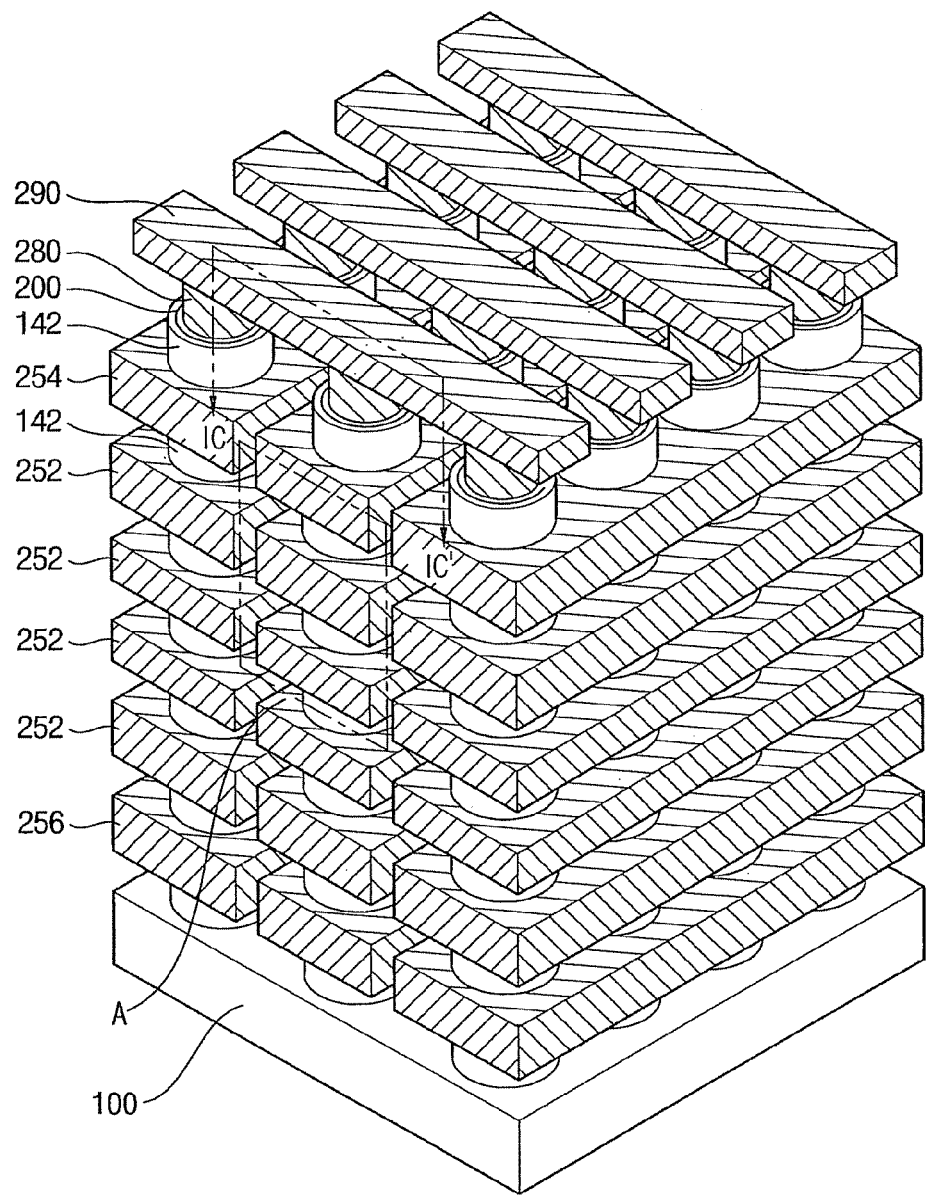
Figure 1A:
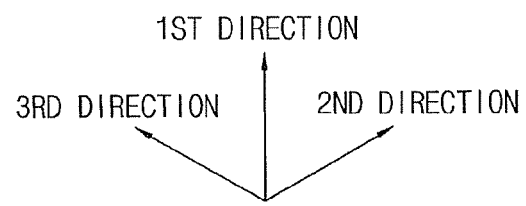

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Detailed Description

Example embodiments will now be described more fully with reference to the accompanying drawings, in which example embodiments are shown. Example embodiments may, however, be embodied in many different forms and should not be construed as limited to the example embodiments set forth herein; rather, these example embodiments are provided so that this description will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
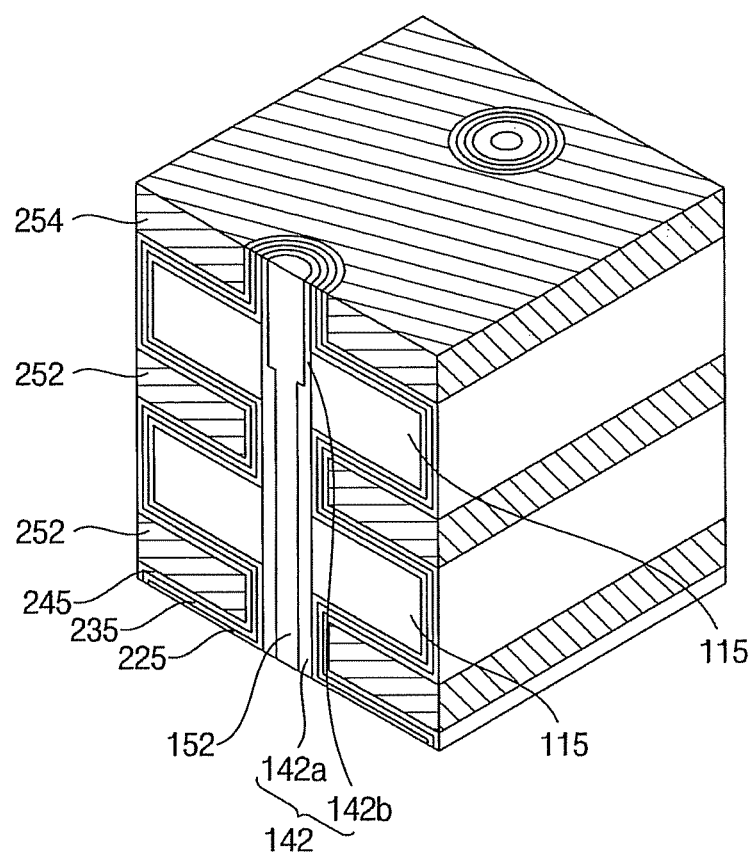
Figure 1B:
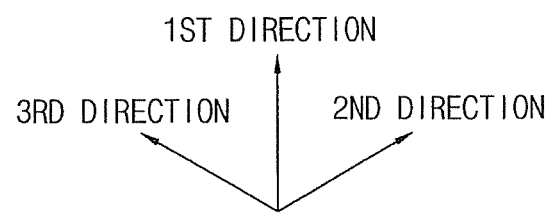
Figure 1C:
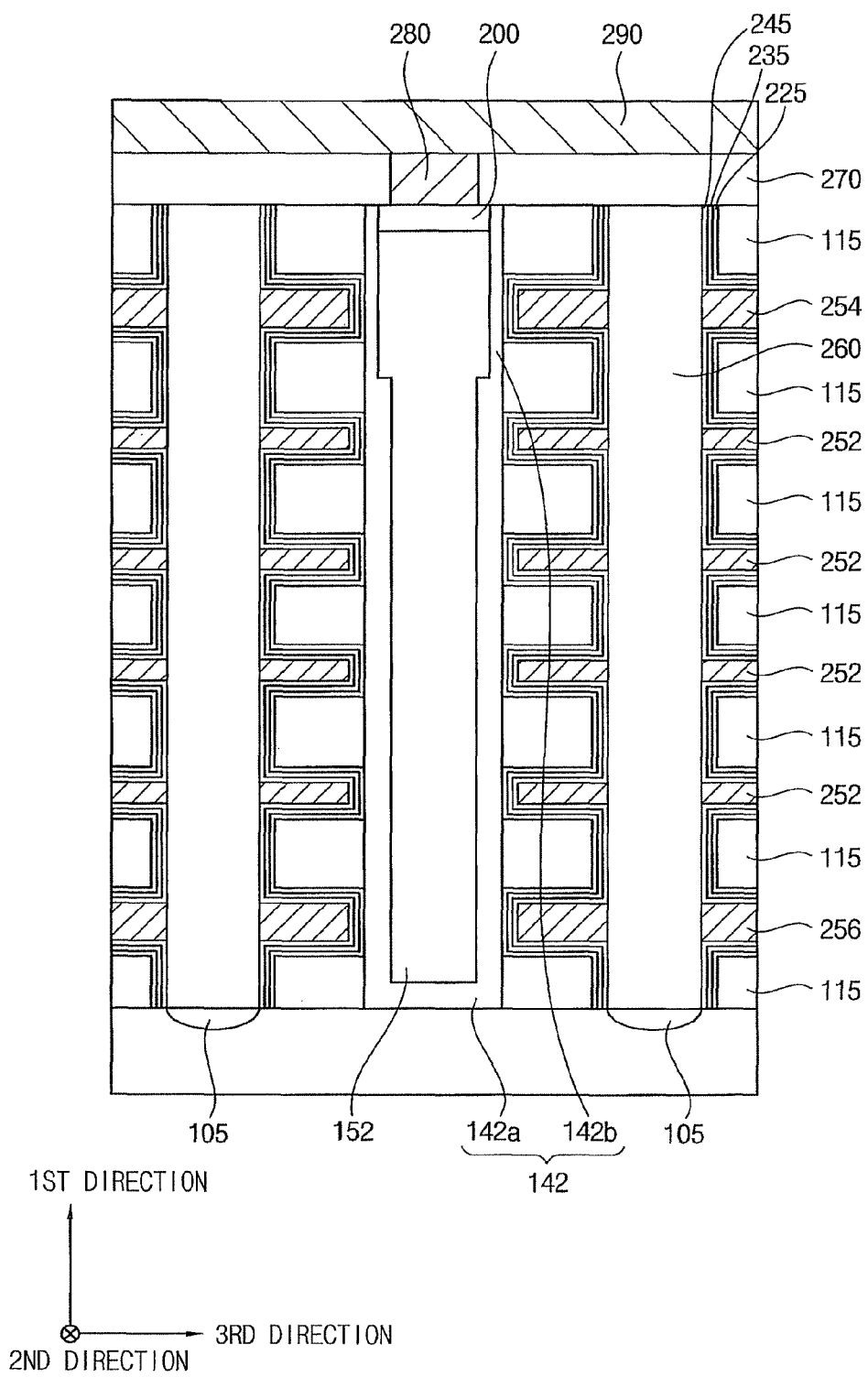

FIGS. 1A, 1B and 1C are a perspective diagram, a local perspective diagram and a cross-sectional view, respectively, illustrating vertical memory devices in accordance with example embodiments. FIG. 1B is a local perspective diagram of region A of a vertical memory device in FIG. 1A, and FIG. 1C is a cross-sectional view of a vertical memory device in FIG. 1A cut along the line IC-IC'. Referring to FIGS. 1A, 1B and 1C, a vertical memory device may include a channel 142 extending in a first direction substantially perpendicular to a top surface of a substrate 100, and a ground selection line (GSL) 256, a word line 252 and a string selection line (SSL) 254 that are on an outer sidewall of the channel 142 along the first direction. The vertical memory device may further include a bit line 290 electrically connected to the channel 142.

According to example embodiments, the channel 142 may include, for example, doped polysilicon and/or single crystalline silicon. According to example embodiments, the channel 142 may include polysilicon doped with p-type impurities. According to example embodiments, a plurality of channels 142 may be formed in a second direction substantially parallel to the top surface of the substrate 100 to define a channel column, and a plurality of channel columns may be formed in a third direction substantially perpendicular to the second direction to define a channel array.

According to example embodiments, the channel 142 may be cup shaped and/or of a hollow cylindrical shape, and include a lower portion 142a with a first thickness and an upper portion 142b having a second thickness less than the first thickness. The upper portion 142b of the channel 142 may be adjacent to the SSL 254, and the lower portion 142a of the channel 142 may be formed adjacent to the GSL 256 and the word line 252. The interface between the lower portion 142a and the upper portion 142b may be lower than the position of the SSL 254 and higher than the position of the word line 252.

A second filling layer pattern 152 may be formed in a space defined by an inner sidewall of the, for example, cup shaped channel 142. The second filling layer pattern 152 may include, for example, an insulating material (e.g., an oxide). The channel 142 may include the lower and upper portions 142a and 142b of the first and second thicknesses, respectively, and the second filling layer pattern 152 may include a lower portion with a relatively small thickness and an upper portion with a relatively large thickness. According to at least one example embodiment, the lower and upper portions of the second filling layer pattern 152 may include, different materials from each other.

A pad 200 may be on the second filling layer pattern 152 to fill the remaining portion of the space defined by the inner sidewall of the channel 142, and may electrically connect the channel 142 to a bit line contact 280. According to at least one example embodiment, the pad 200 may include doped polysilicon.

Each of the GSL 256, the word line 252 and the SSL 254 may be at one level (e.g., one of each, each at a different height) or more than one level, and a first insulation layer pattern 115 may be interposed therebetween. According to at least one example embodiment, the GSL 256 and the SSL 254 may be at one level, and the word line 252 may be at 4 levels between the GSL 256 and the SSL 254. The GSL 256 and the SSL 254 may be at 2 levels (e.g., two of each at different heights), respectively, and the word line 252 may be formed at 2 or 8 levels. According to example embodiments, each of the GSL 256, the word line 252 and the SSL 254 may extend in the second direction, and a plurality of GSLs 256, a plurality of word lines 252, and a plurality of SSLs 254 may be in the third direction. The first insulation layer pattern 115 may include, for example, a silicon oxide (e.g., silicon dioxide ($SiO_2$), silicon oxycarbide (SiOC) and/or silicon oxyfluoride (SiOF)).

A tunnel insulation layer pattern 225, a charge trapping layer pattern 235 and a blocking layer pattern 245 may be between each of the GSL 256, the word line 252 and the SSL 254, and the outer sidewall of the channel 142 in a direction substantially perpendicular to the outer sidewall of the channel 142. The tunnel insulation layer pattern 225, the charge trapping layer pattern 235 and the blocking layer pattern 245 may be between each of the GSL 256, the word line 252 and the SSL 254, and the first insulation layer pattern 115 and/or on a sidewall of the first insulation layer pattern 115. According to at least one example embodiment, the tunnel insulation layer pattern 225 may be only on the outer sidewall of the channel 142.

According to example embodiments, the GSL 256, the word line 252 and the SSL 254 may include, for example, a metal and/or a metal nitride. For example, the GSL 256, the word line 252 and the SSL 254 may include a metal and/or a metal nitride with low electrical resistance (e.g., tungsten, tungsten nitride, titanium, titanium nitride, tantalum, tantalum nitride and/or platinum). According to at least one example embodiment, each of the GSL 256, the word line 252 and the SSL 254 may be a multi-layered structure including a barrier layer, for example, a metal nitride and/or a metal layer including a metal.

According to example embodiments, the tunnel insulation layer pattern 225 may include a silicon oxide, and the charge trapping layer pattern 235 may include a nitride (e.g., a silicon nitride and/or a metal oxide). According to example embodiments, the blocking layer pattern 245 may include a silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide). According to at least one example embodiment, the blocking layer pattern 245 may be a multi-layered structure of a silicon oxide layer and a metal oxide layer.

A second insulation layer pattern 260 may be between structures each of which may include the GSL 256, the word line 252 and the SSL 254 extending in the second direction and the first insulation layer pattern 115 therebetween. The second insulation layer pattern 260 may include an insulating material (e.g., an oxide). An impurity region 105 may be at an upper portion of the substrate 100 beneath the second insulation layer pattern 260, which may extend in the second direction and serve as a common source line (CSL). According to example embodiments, the impurity region 105 may include n-type impurities, for example, phosphorus and/or arsenic.

The bit line 290 may be electrically connected to the pad 200 via the bit line contact 280, and may be electrically connected to the channel 142. The bit line 290 may include, for example, a metal, a metal nitride and/or doped polysilicon. According to example embodiments, the bit line 290 may extend in the third direction. The bit line contact 280 may be contained in a third insulation layer 270, and contact the pad 200. The bit line contact 280 may include, for example, a metal, a metal nitride and/or doped polysilicon. The third insulation layer 270 may be on the first and second insulation layer patterns 115 and 260, the pad 200, the blocking layer pattern 245, the charge trapping layer pattern 235 and the tunnel insulation layer pattern 225. According to example embodiments, the third insulation layer 270 may include an insulating material, for example, an oxide.

The vertical memory device may include the channel 142 of different thicknesses according to position or height. The channel 142 may include the upper portion 142b of a relatively small thickness adjacent to the SSL 254, so that the vertical memory device may have a narrow and/or reduced threshold voltage distribution and low and/or decreased switching variation, because of the small grain size and the little and/or decreased trap number of the channel 142. The channel 142 may include the lower portion 142a of a relatively large thickness adjacent to the word line 252, so that endurance with respect to repetition of writing/erasing operations of the vertical memory device may be good and/or increased, because of the reduction of the interface trap number of the channel 142 by the large grain size. The vertical memory device may have both good and/or improved threshold voltage and switching characteristics, and good endurance, thereby having improved operation characteristics and reliability.

Figure 2:
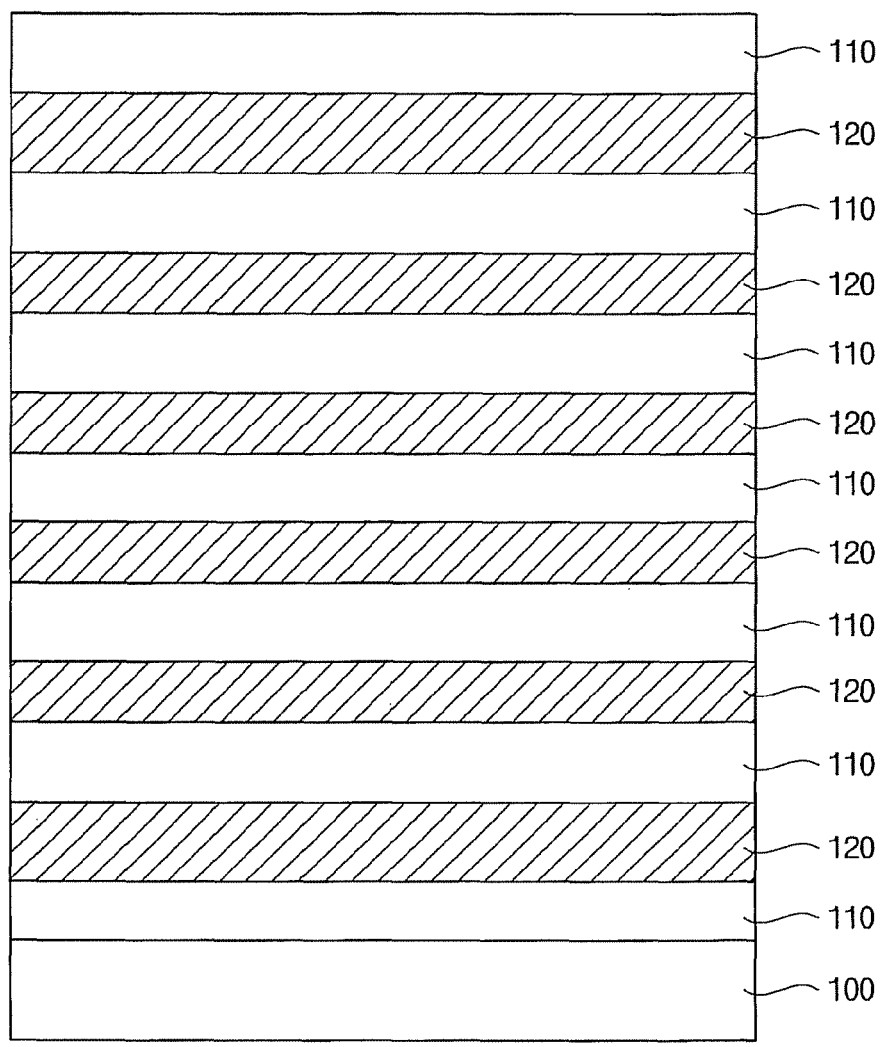
Figure 2:
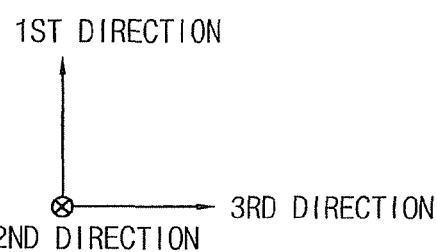

FIGS. 2-13 are cross-sectional diagrams illustrating methods of manufacturing a vertical memory device of FIG. 1 in accordance with example embodiments. Referring to FIG. 2, a first insulation layer 110 and a sacrificial layer 120 may be alternately and repeatedly formed on a substrate 100. A plurality of first insulation layers 110 and a plurality of sacrificial layers 120 may be alternately faulted on each other at a plurality of levels, respectively. The substrate 100 may include a semiconductor material, for example, silicon and/or germanium. The substrate 100 may be, for example, a bulk semiconductor or a semiconductor layer.

According to example embodiments, the first insulation layer 110 and the sacrificial layer 120 may be formed by, for example, a chemical vapor deposition (CVD) process, a plasma enhanced chemical vapor deposition (PECVD) process and/or an atomic layer deposition process (ALD) process. The first insulation layer 110, which may be formed directly on a top surface of the substrate 100, may be formed by, for example, a thermal oxidation process. According to example embodiments, the first insulation layer 110 may be formed to include a silicon oxide, for example, silicon dioxide ($SiO_2$), silicon oxycarbide (SiOC) and/or silicon oxyfluoride (SiOF). The sacrificial layer 120 may be formed to include, for example, a material with etch selectivity to the first insulation layer 110 (e.g., silicon nitride and/or silicon boronitirde).

According to example embodiments, the sacrificial layer 120 at a level at which a GSL 256 (refer to FIG. 12) or an SSL 254 (refer to FIG. 13) may be formed may be of a thickness greater than that of the sacrificial layer 120 at a level at which a word line 252 (refer to FIG. 13) may be formed. The first insulation layer 110 adjacent to the sacrificial layer 120 at which the GSL 256 or the SSL 254 may be formed may be of a thickness greater than that of the first insulation layer 110 adjacent to the sacrificial layer 120 at which the word line 252 may be formed.

The number of the first insulation layer 110 and the number of the sacrificial layer 120 stacked on the substrate 100 may vary according to the desired number of the GSL 256, the word line 252 and the SSL 254. According to at least one example embodiment, each of the GSL 256 and the SSL 254 may be formed at a single level, and the word line 252 may be formed at 4 levels. The sacrificial layer 120 may be formed at 6 levels, and the first insulation layer 110 may be formed at 7 levels. According to at least one example embodiment, each of the GSL 256 and the SSL 254 may be formed at 2 levels, and the word line 252 may be formed at 2 or 8 levels. In this case, the sacrificial layer 120 may be formed at 6 or 12 levels, and the first insulation layer 110 may be formed at 7 or 13 levels. However, the number of GSLs 256, SSLs 254 and word lines 252 is not limited herein.

Figure 3:
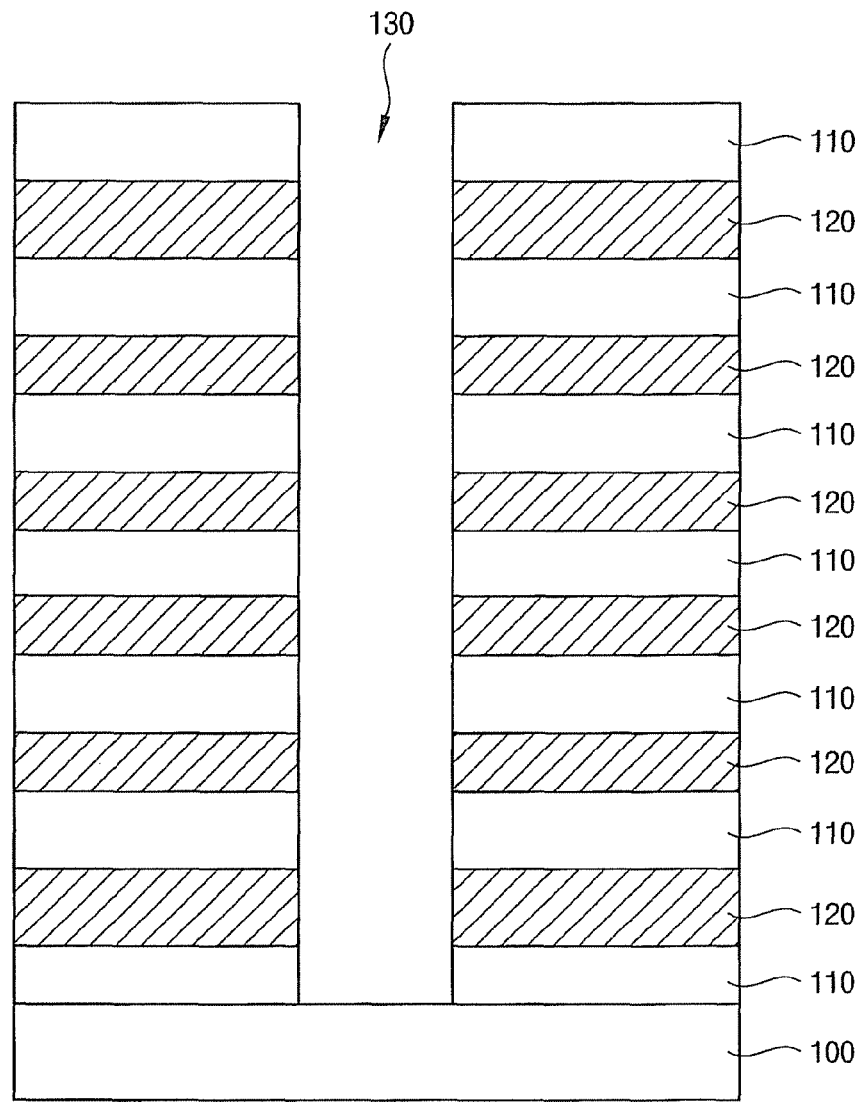
Figure 3:
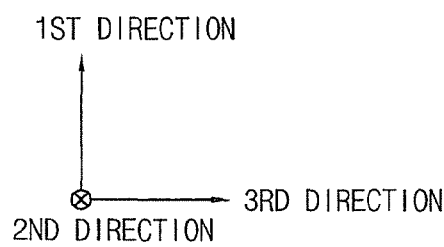

Referring to FIG. 3, a first opening 130 may be formed through the first insulation layer 110 and the sacrificial layer 120 to expose a top surface of the substrate 100. According to example embodiments, after forming a hard mask (not shown) on an uppermost first insulation layer 110, the first insulation layers 110 and the sacrificial layers 120 may be dry etched using the hard mask as an etch mask to form the first opening 130. The first opening 130 may extend in a first direction substantially perpendicular to the top surface of the substrate 100. Due to the characteristics of a dry etch process, the first opening 130 may be of a width that becomes gradually smaller from a top portion to a bottom portion thereof.

According to example embodiments, a plurality of first openings 130 may be formed in a second direction substantially parallel to the top surface of the substrate 100 to define a first opening column, and a plurality of first opening columns may be formed in a third direction substantially perpendicular to the second direction to define a first opening array.

Figure 4:
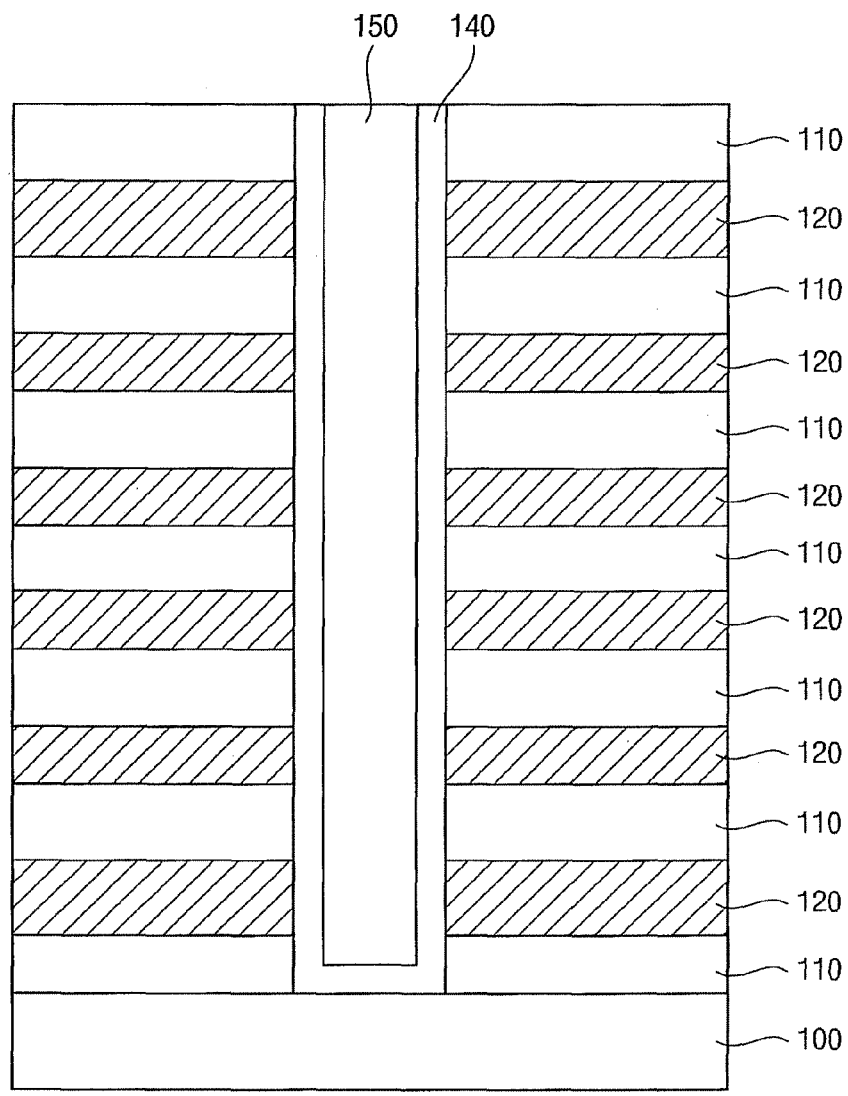
Figure 4:
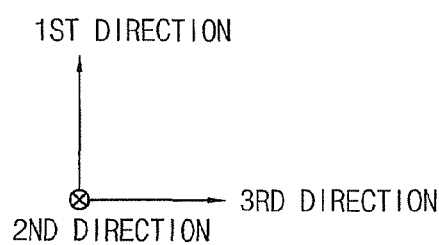

Referring to FIG. 4, a first channel layer pattern 140 may be formed on a sidewall of the first opening 130 and on the exposed top surface of the substrate 100, and a first filling layer pattern 150 may be formed on the first channel layer pattern 140 to fill the remaining portion of the first opening 130. A first channel layer may be formed on the exposed top surface of the substrate 100, the sidewall of the first opening 130 and the first insulation layer 110, and a first filling layer may be formed on the first channel layer to fill the remaining portion of the first opening 130. According to example embodiments, the first channel layer may be formed to include, for example, doped polysilicon, single crystalline silicon and/or amorphous silicon.

When the first channel layer is formed using amorphous silicon, a laser epitaxial growth (LEG) process and/or a solid phase epitaxy (SPE) process may be further performed to convert the amorphous silicon into single crystalline silicon. According to at least one example embodiment, the first channel layer may be formed to include polysilicon doped with p-type impurities. The first filling layer may be formed to include, for example, an insulating material (e.g., an oxide).

Upper portions of the first filling layer and the first channel layer may be planarized until a top surface of the first insulation layer 110 is exposed to form a first filling layer pattern 150 and a first channel layer pattern 140, respectively, filling the first opening 130. The first channel layer pattern 140 may be cup shaped and/or of a hollow cylindrical shape on the sidewall of the first opening 130 and the exposed top surface of the substrate 100. According to example embodiments, a first channel layer pattern column and/or a first channel layer pattern array, which may correspond to the first opening column and/or the first opening array, may be formed. The planarization process may be performed by, for example, a chemical mechanical polishing (CMP) process and/or an etch back process.

Figure 5:
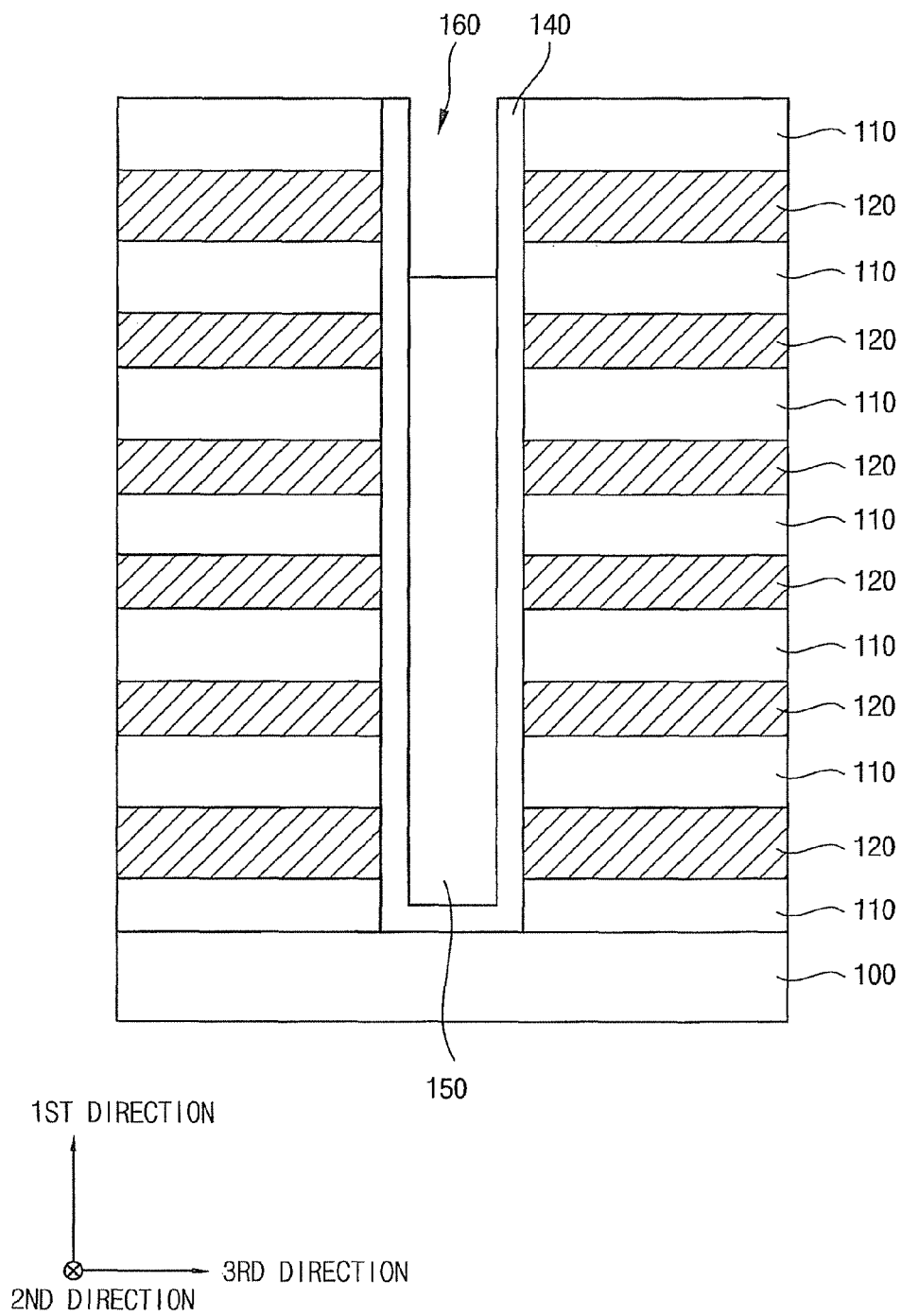

Referring to FIG. 5, an upper portion of the first filling layer pattern 150 may be removed to form a first recess 160. An upper portion of the first channel layer pattern 140 may be exposed. According to example embodiments, the first filling layer pattern 150 may be removed by, for example, an etch-back process. According to example embodiments, the first recess 160 may be formed to with a bottom lower than that of the sacrificial layer 120 at the level at which an SSL 254 may be formed.

Figure 6:
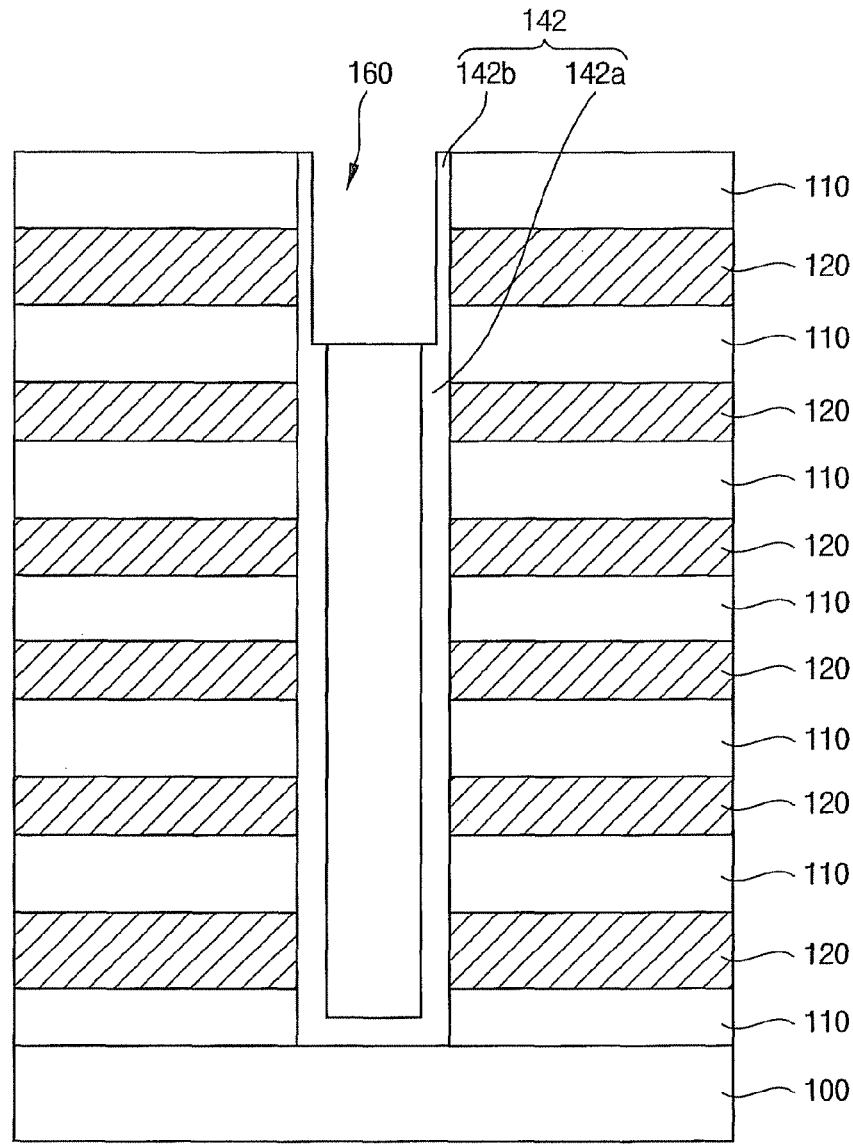

Referring to FIG. 6, the exposed upper portion of the first channel layer pattern 140 may be partially removed to form a channel 142. According to example embodiments, a wet etch process using, for example, an etch solution (e.g., SC-1 solution) may be performed to partially remove the exposed upper portion of the first channel layer pattern 140 to form the channel 142. The channel 142 may include an upper portion 142b of a thickness less than that of an upper portion of the first channel layer pattern 140, and a lower portion 142a of a thickness substantially the same as that of a lower portion of the first channel layer pattern 140.

The thicknesses of the lower and upper portions of the channel 142 may be defined as first and second thicknesses, respectively, and the first thickness may be greater than the second thickness. According to example embodiments, the channel 142 may be cup shaped and/or of a hollow cylindrical shape like the first channel layer pattern 140, but the thickness of the channel 142 may be different according to position or height. According to example embodiments, a channel column and/or a channel array, which may correspond to the first opening column and/or the first opening array, may be formed.

Figure 7:
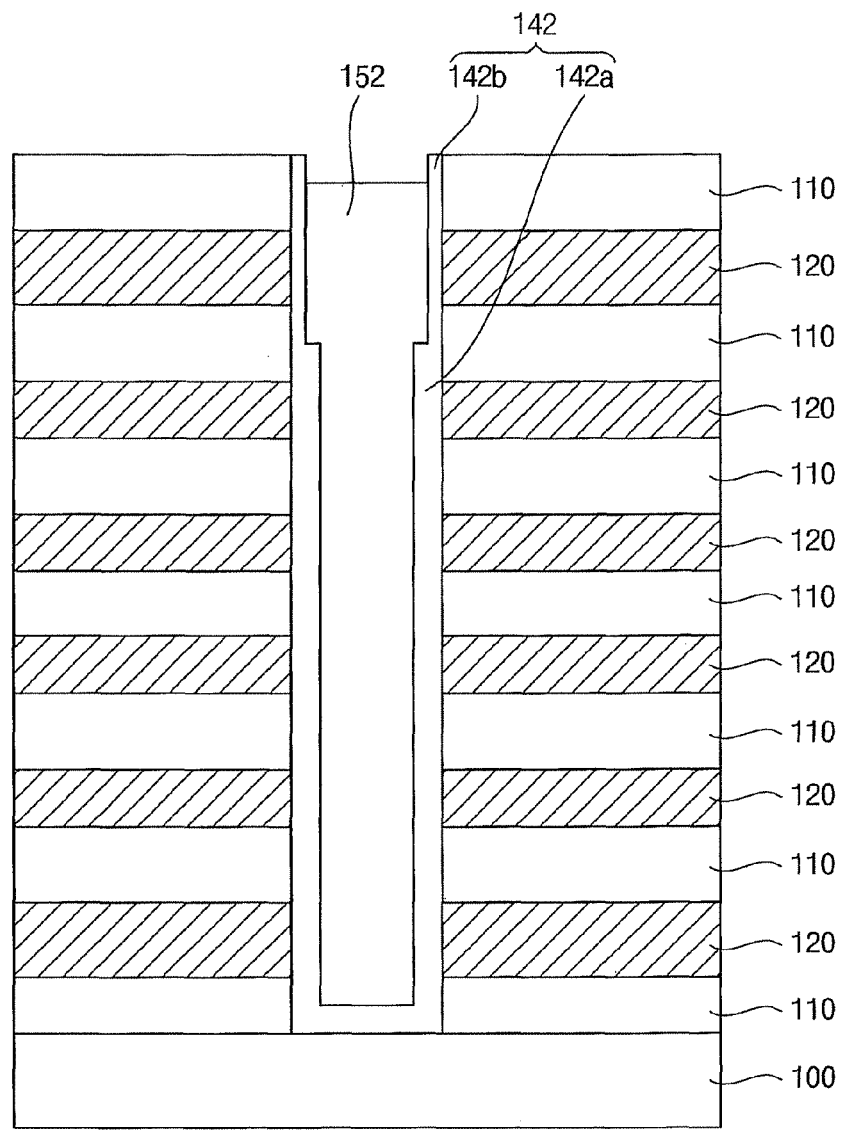
Figure 7:
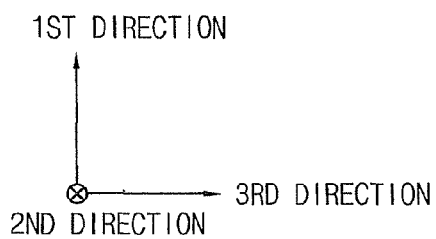

Referring to FIG. 7, a second filling layer pattern 152 partially filling the first opening 130 and the first recess 160 may be formed. A second filling layer filling the first recess 160 may be formed on the first filling layer pattern 150, the channel 142 and the first insulation layer 110, and the second filling layer may be planarized until a top surface of the first insulation layer 110 is exposed. According to example embodiments, the second filling layer may be formed using an insulating material (e.g., an oxide) and the planarization may be performed by a CMP process. An upper portion of the second filling layer may be removed to form the second filling layer pattern 152. The second filling layer pattern 152 may be formed to with a top surface higher than that of the sacrificial layer 120 at the level at which an SSL 252 may be formed. According to example embodiments, the second filling layer may be formed using a material substantially the same as that of the first filling layer, and thus may be merged into the first filling layer pattern 150 and form the second filling layer pattern 152 after an upper portion of the second filling layer is removed. According to at least one example embodiment, the second filling layer may be formed using a material different from that of the first filling layer.

Figure 8:
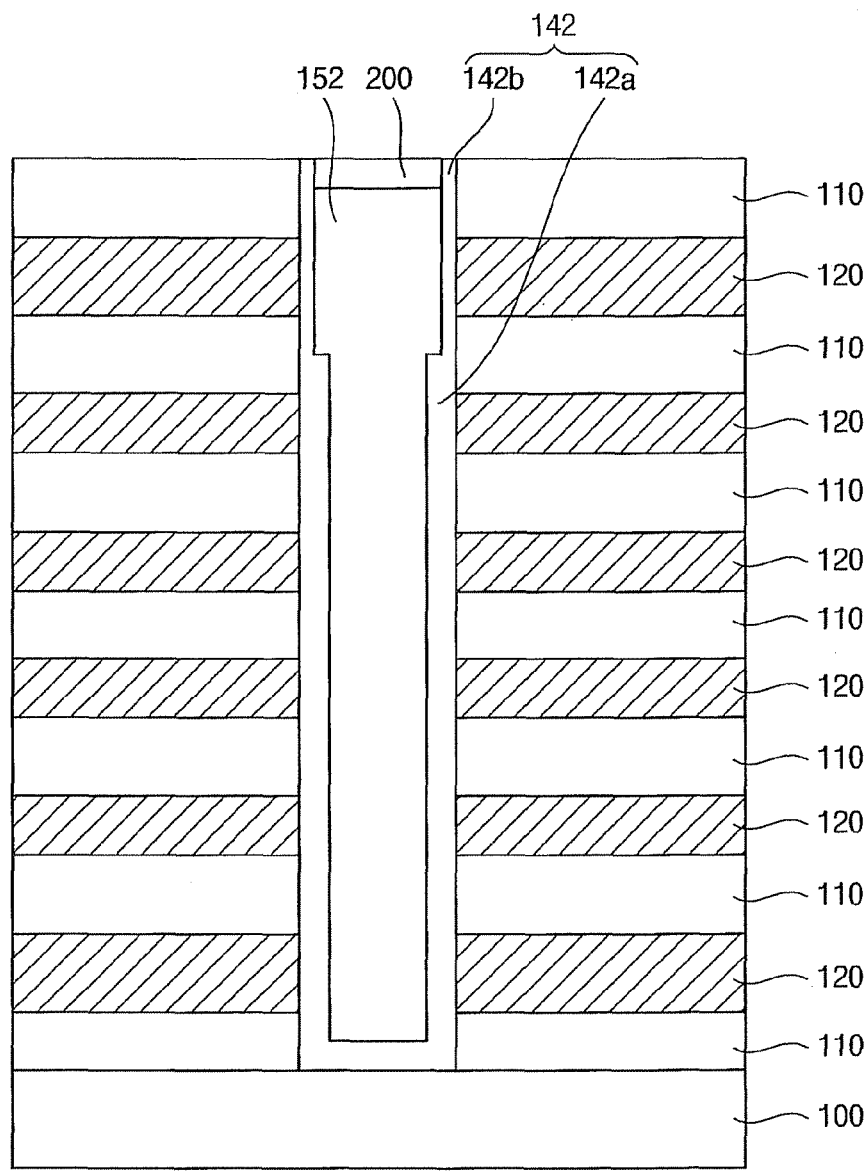
Figure 8:
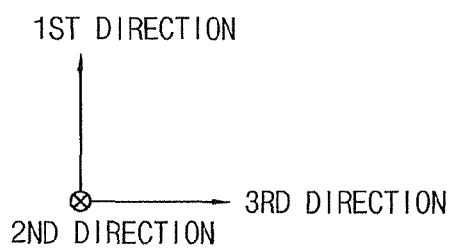

Referring to FIG. 8, a pad 200 filling the remaining portion of the first recess 160 may be formed. A pad layer filling the remaining portion of the first recess 160 may be formed on the second filling layer pattern 152, the channel 142 and the first insulation layer 110, and planarized until a top surface of the first insulation layer 110 is exposed to form the pad 200. According to example embodiments, the pad layer may be formed to include, for example, doped polysilicon. The planarization may be performed by, for example, a CMP process.

Figure 9:
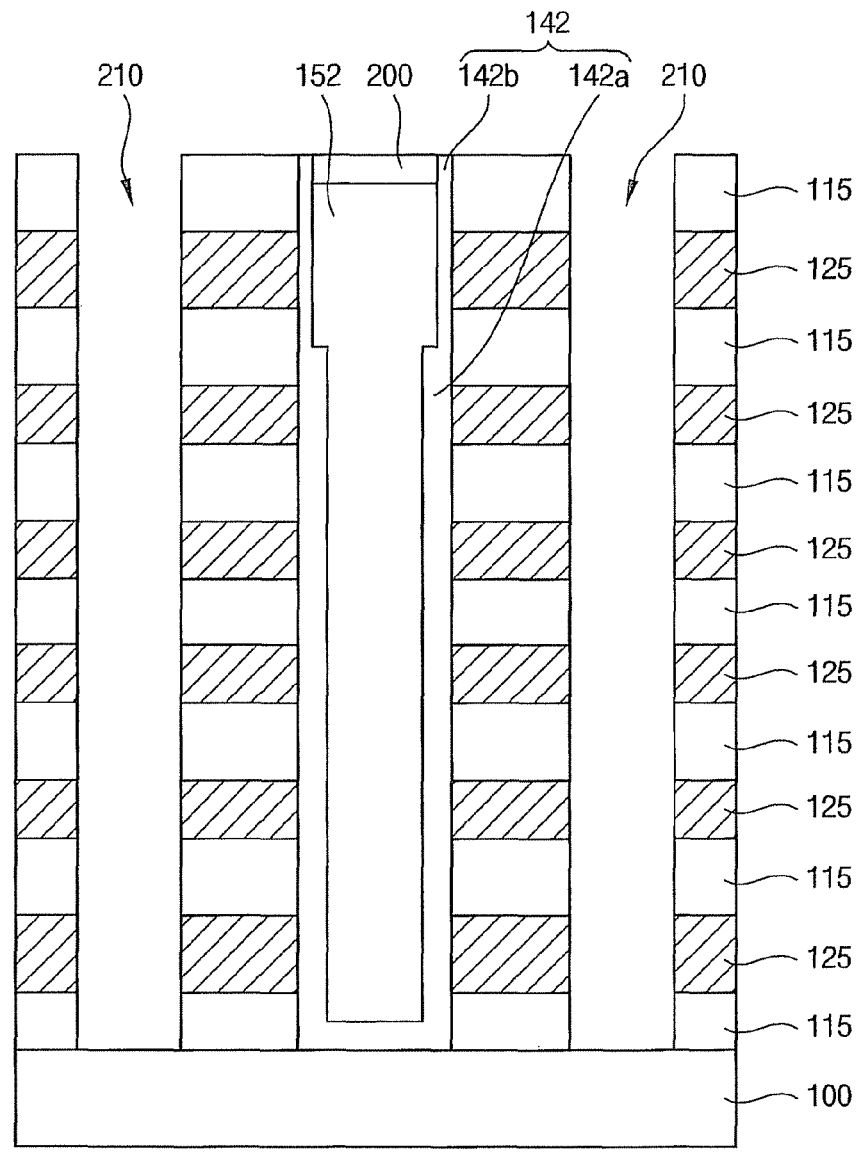

Referring to FIG. 9, a second opening 210 may be formed through the first insulation layers 110 and the sacrificial layers 120 to expose a top surface of the substrate 100. According to example embodiments, after foaming a hard mask (not shown) on the uppermost first insulation layer 110, the insulation layers 110 and the sacrificial layers 120 may be, for example, dry etched using the hard mask as an etch mask to form the second opening 210. The second opening 210 may extend in the first direction.

According to example embodiments, a plurality of second openings 210 may be formed in the third direction, and each second opening 210 may extend in the second direction. The first insulation layer 110 and the sacrificial layer 120 may be transformed into a first insulation layer pattern 115 and a sacrificial layer pattern 125, respectively. A plurality of first insulation layer patterns 115 and a plurality of sacrificial layer patterns 125 may be formed in the third direction at each level, and each first insulation layer pattern 115 and each sacrificial layer pattern 125 may extend in the second direction.

Figure 10:
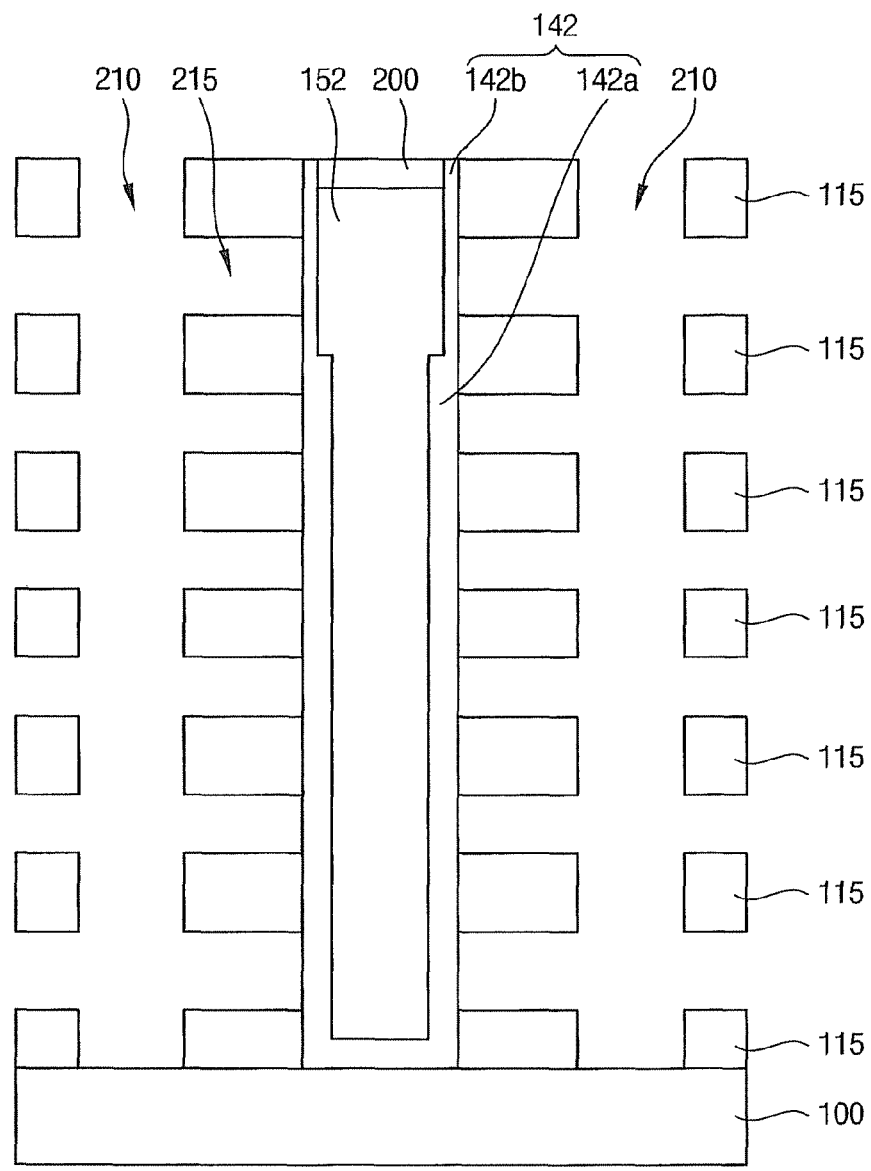
Figure 10:
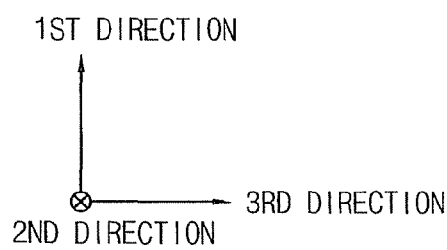

Referring to FIG. 10, the sacrificial layer patterns 125 may be removed to form a gap 215 between the first insulation layer patterns 115 at adjacent levels. According to example embodiments, a plurality of gaps 215 may be formed between the first insulation layer patterns 115, respectively. An outer sidewall of the channel 142 may be exposed by the gap 215. According to example embodiments, the sacrificial layer patterns 125 exposed by the second opening 210 may be removed by, for example, a wet etch process using an etch solution including phosphoric acid and/or sulfuric acid.

Figure 11:
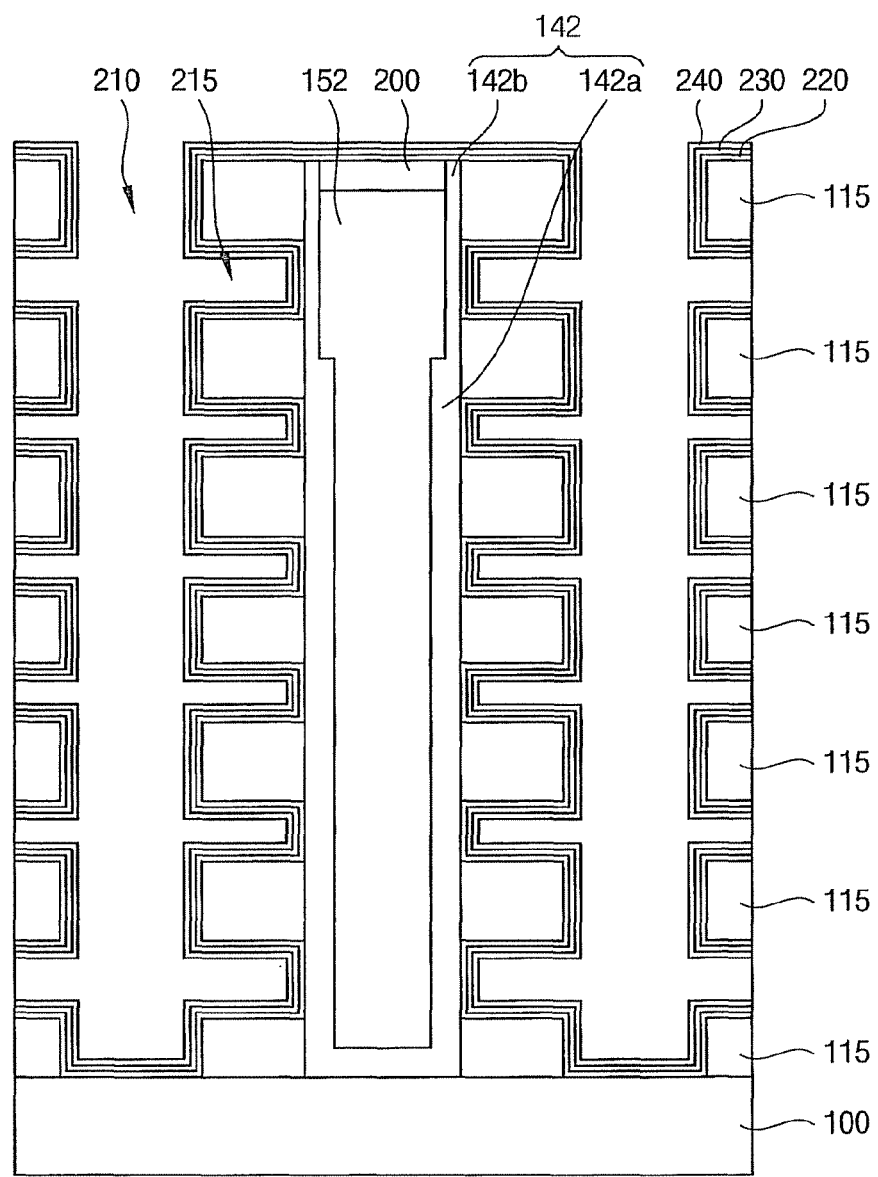
Figure 11:
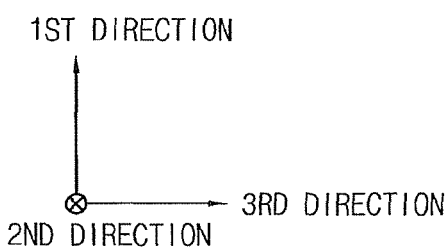

Referring to FIG. 11, a tunnel insulation layer 220, a charge trapping layer 230 and a blocking layer 240 may be sequentially formed on the exposed outer sidewall of the channel 142, an inner wall inside the gap 215, a surface of the first insulation layer pattern 115, the exposed top surface of the substrate 100, and top surfaces of the channel 142 and the pad 200. According to example embodiments, the tunnel insulation layer 220 may be, for example, formed to include a silicon oxide by a CVD process. According to at least one example embodiment, the tunnel insulation layer 220 may be formed by a thermal oxidation on the exposed outer sidewall of the channel 142 in the gap 215. In this case, the tunnel insulation layer 220 may not be formed on the surface of the first insulation layer pattern 115.

The charge trapping layer 230 may be formed to include a nitride, for example, a silicon nitride and/or a metal oxide. The blocking layer 240 may be formed to include, for example, a silicon oxide and/or a metal oxide. For example, the metal oxide may include aluminum oxide, hafnium oxide, lanthanum oxide, lanthanum aluminum oxide, lanthanum hafnium oxide, hafnium aluminum oxide, titanium oxide, tantalum oxide and/or zirconium oxide. According to at least one example embodiment, the blocking layer 240 may be formed to be a multi-layered structure including a silicon oxide layer and a metal oxide layer.

Figure 12:
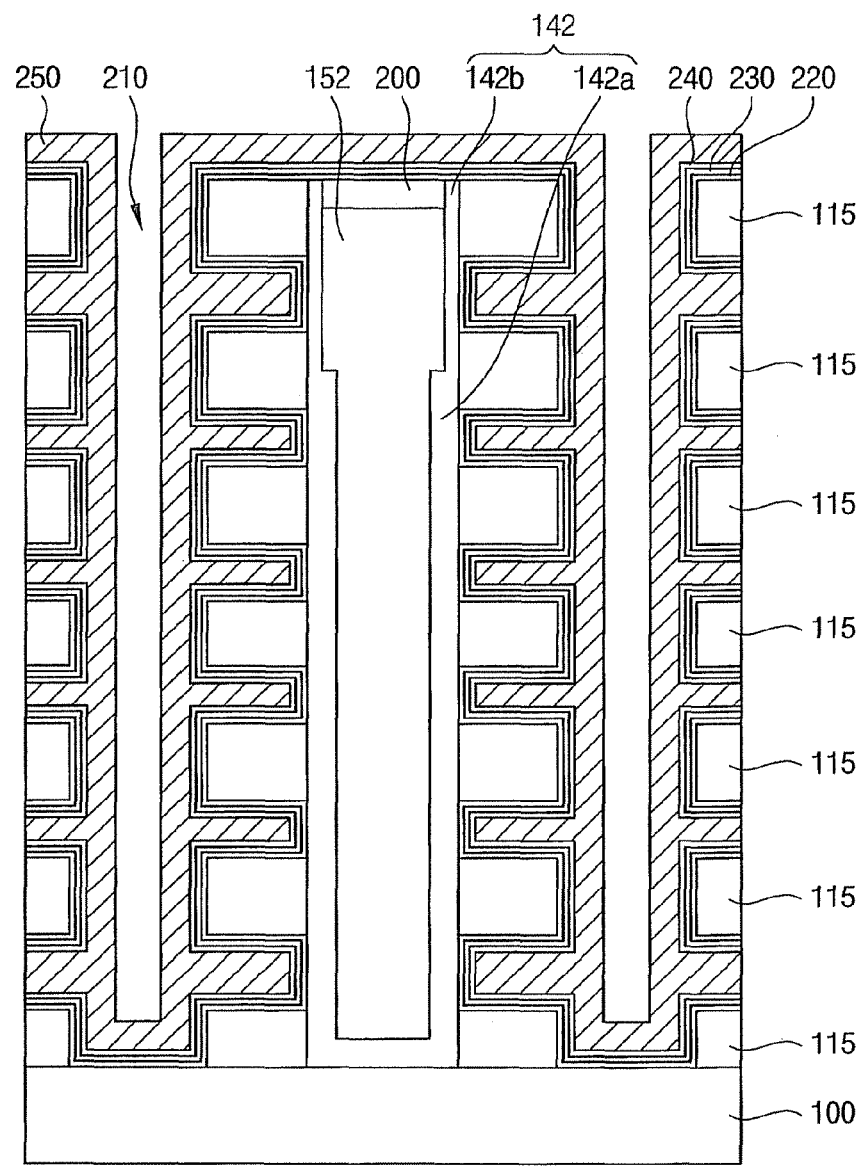
Figure 12:
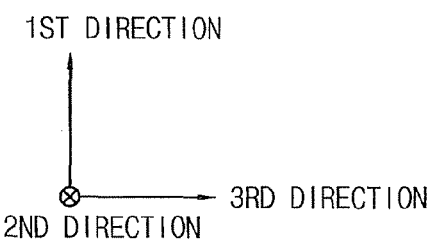

Referring to FIG. 12, a gate electrode layer 250 may be formed on the blocking layer 240 to fill the gap 215. According to example embodiments, the gate electrode layer 250 may be formed to include a metal and/or a metal nitride. For example, the gate electrode layer 250 may be formed to include a metal and/or a metal nitride with a low electrical resistance, for example, tungsten, tungsten nitride, titanium, titanium nitride, tantalum, tantalum nitride and/or platinum. According to at least one example embodiment, the gate electrode layer 250 may be formed to be a multi-layered structure of a barrier layer including a metal nitride and a metal layer including a metal.

Figure 13:
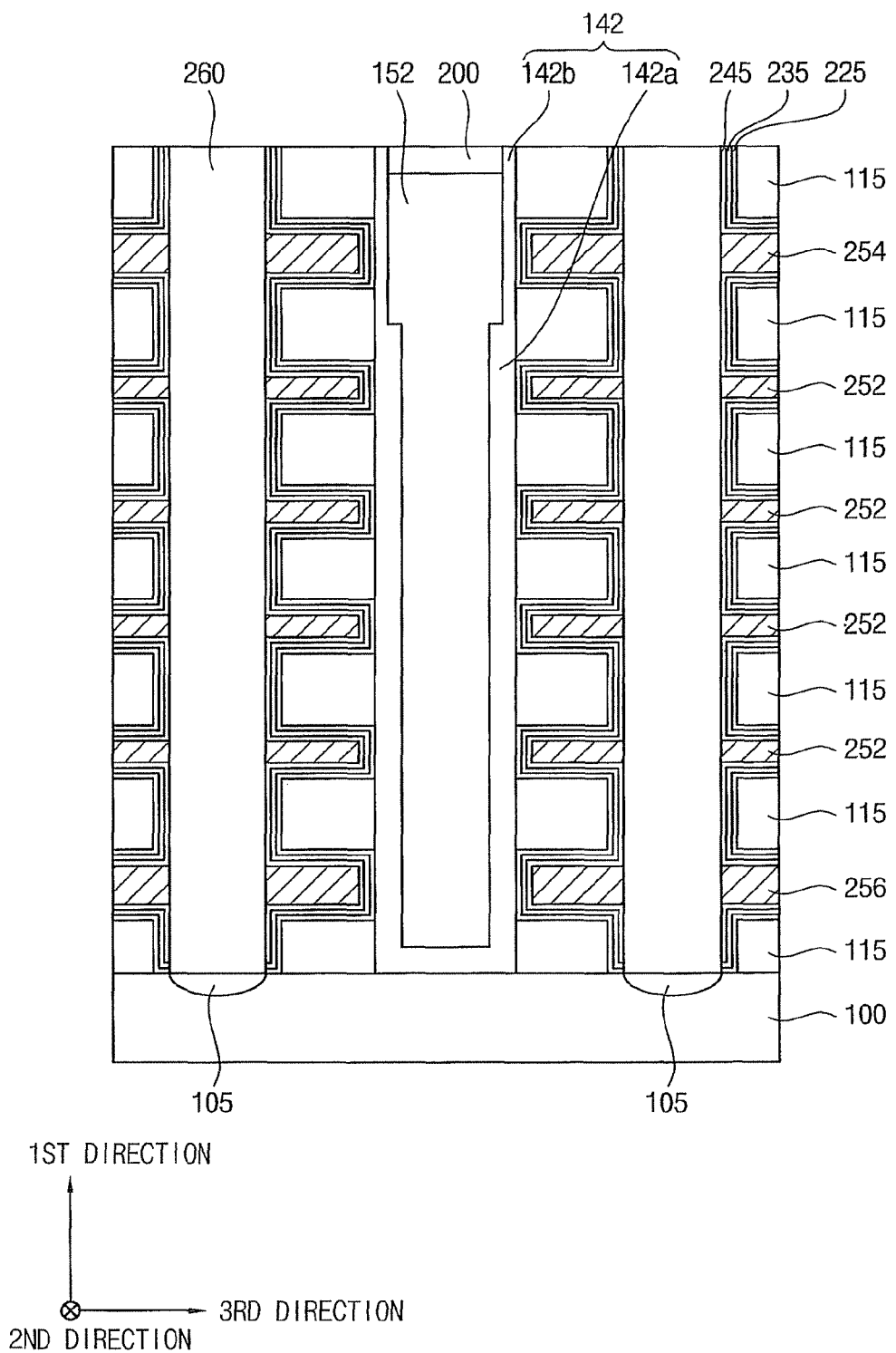

The gate electrode layer 250 may be formed by, for example, a CVD process and/or an ALD process, and the second opening 210 may be partially filled. Referring to FIG. 13, the gate electrode layer 250 may be partially removed to form the GSL 256, the word line 252 and the SSL 254 in the gaps 215. According to example embodiments, the gate electrode layer 250 may be partially removed by, for example, a wet etch process. Each of the GSL 256, the word line 252 and the SSL 254 may be formed at a single level or at a plurality of levels. According to at least one example embodiment, each of the GSL 256 and the SSL 254 may be formed at a single level, and the word line 252 may be formed at 4 levels between the GSL 256 and the SSL 254. However, the number of GSLs 256, word lines 252 and SSLs 254 is not limited.

When the gate electrode layer 250 is partially removed, portions of the blocking layer 240, the charge trapping layer 230 and the tunnel insulation layer 220 on top surfaces of the first insulation layer pattern 115, the substrate 100, the channel 142 and the pad 200 may also be removed to Rhin a blocking layer pattern 245, a charge trapping layer pattern 235 and a tunnel insulation layer pattern 225, respectively. According to at least one example embodiment, portions of the blocking layer 240, the charge trapping layer 230 and the tunnel insulation layer 220 on a sidewall of the first insulation layer pattern 115 may be also removed so that the blocking layer pattern 245, the charge trapping layer pattern 235 and the tunnel insulation layer pattern 225 may be formed only on the inner wall of the gap 215.

In a process in which the gate electrode layer 250, the blocking layer 240, the charge trapping layer 230 and the tunnel insulation layer 220 are partially removed, a third opening (not shown) exposing a top surface of the substrate 100 and extending in the second direction may be formed, and impurities may be implanted into the exposed top surface of the substrate 100 to form an impurity region 105. According to example embodiments, the impurities may include n-type impurities, for example, phosphorus and/or arsenic. According to example embodiments, the impurity region 105 may extend in the second direction and serve as a CSL.

A second insulation layer pattern 260 filling the third opening may be formed. According to example embodiments, after a second insulation layer filling the third opening is formed on the substrate 100 and the first insulation layer pattern 115, the second insulation layer may be planarized until a top surface of the first insulation layer pattern 115 is exposed to form the second insulation layer pattern 260.

Referring to FIG. 1C, a third insulation layer 270 may be formed on the first and second insulation layer patterns 115 and 260, the channel 142, the pad 200, the blocking layer pattern 245, the charge trapping layer pattern 235 and the tunnel insulation layer pattern 225, and a fourth opening (not shown) may be formed to expose a top surface of the pad 200. According to example embodiments, a plurality of fourth openings corresponding to the channels 142 and the pads 200 may be formed in the second direction to define a fourth opening column, and a plurality of fourth opening columns may be formed in the third direction to define a fourth opening array.

A bit line contact 280 may be formed on the pad 200 to fill the fourth opening. The bit line contact 280 may be formed to include, for example, a metal, a metal nitride and/or doped polysilicon. A bit line 290 electrically connected to the bit line contact 280 may be formed to complete the vertical memory device. The bit line 290 may be formed to include, for example, a metal, a metal nitride and/or doped polysilicon. According to example embodiments, the bit line 290 may be formed to extend in the third direction.

According to example embodiments, after forming the first channel layer pattern 140 and the first filling layer pattern 150 filling the first opening 130, an upper portion of the first filling layer pattern 150 may be removed to expose an upper portion of the first channel layer pattern 140. The exposed upper portion of the first channel layer pattern 140 may be partially removed by a wet etch process to form the channel 142 including the lower and upper portions 142a and 142b of different thicknesses. The upper portion 142b of the channel 142 may be formed to be adjacent to the SSL 254.

Figure 14:
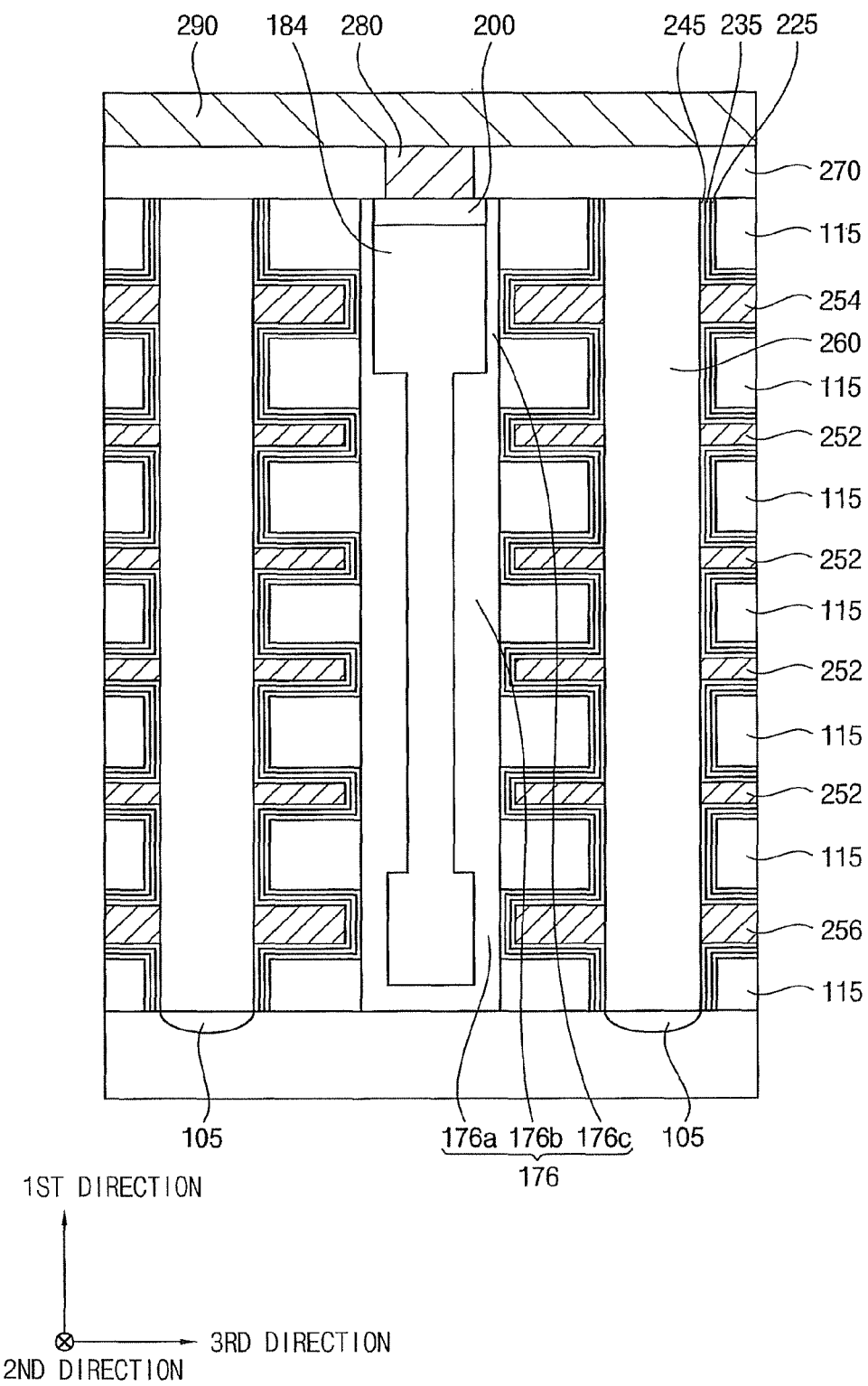

FIG. 14 is a cross-sectional diagram illustrating vertical memory devices in accordance with other example embodiments. The vertical memory device of FIG. 14 may be substantially the same as or similar to that of FIG. 1 except for the shapes of a channel and a filling layer pattern, and thus repetitive explanations thereabout may be omitted herein.

Referring to FIG. 14, a channel 176 may be, for example, cup shaped and/or of a hollow cylindrical shape, and include a lower portion 176a of a first thickness, a central portion 176b of a second thickness greater than the first thickness, and an upper portion 176c of a third thickness less than the second thickness. The upper portion 176c of the channel 176 may be formed adjacent to the SSL 254, the central portion 176b of the channel 176 may be formed adjacent to the word line 252, and the lower portion 176a of the channel 176 may be formed adjacent to the GSL 256. The interface between the lower portion 176a and the central portion 176b may be lower than the position of the word line 252 and higher than the position of the GSL 256, and the interface between the upper portion 176c and the central portion 176b may be lower than the position of the SSL 254 and higher than the position of the word line 252.

A third filling layer pattern 184 may be formed in a space defined by an inner sidewall of the channel 176 having the cup shape. The third filling layer pattern 184 may include an insulating material, for example, an oxide. The channel 176 may include the lower, central and upper portions 176a, 176b and 176c of the first, second and third thicknesses, respectively, and thus the third filling layer pattern 184 may include lower and upper portions of relatively small thicknesses and a central portion of a relatively large thickness. According to at least one example embodiment, the lower, central and upper portions of the third filling layer pattern 184 may include different materials from one another.

The vertical memory device may include the channel 176 with different thicknesses according to position or height. The channel 176 may include the lower and upper portions 176a and 176c of relatively small thicknesses adjacent to the GSL 256 and the SSL 254, so that the vertical memory device may have a narrow and/or reduced threshold voltage distribution and a low and/or decreased switching variation, because of the small grain size and the little and/or decreased trap number of the channel 176. The channel 176 may include the central portion 176b of a relatively large thickness adjacent to the word line 252, so that the endurance with respect to repetition of writing/erasing operations of the vertical memory device may be good and/or increased, because of the reduction of the interface trap number of the channel 176 by the large grain size.

Figure 15:
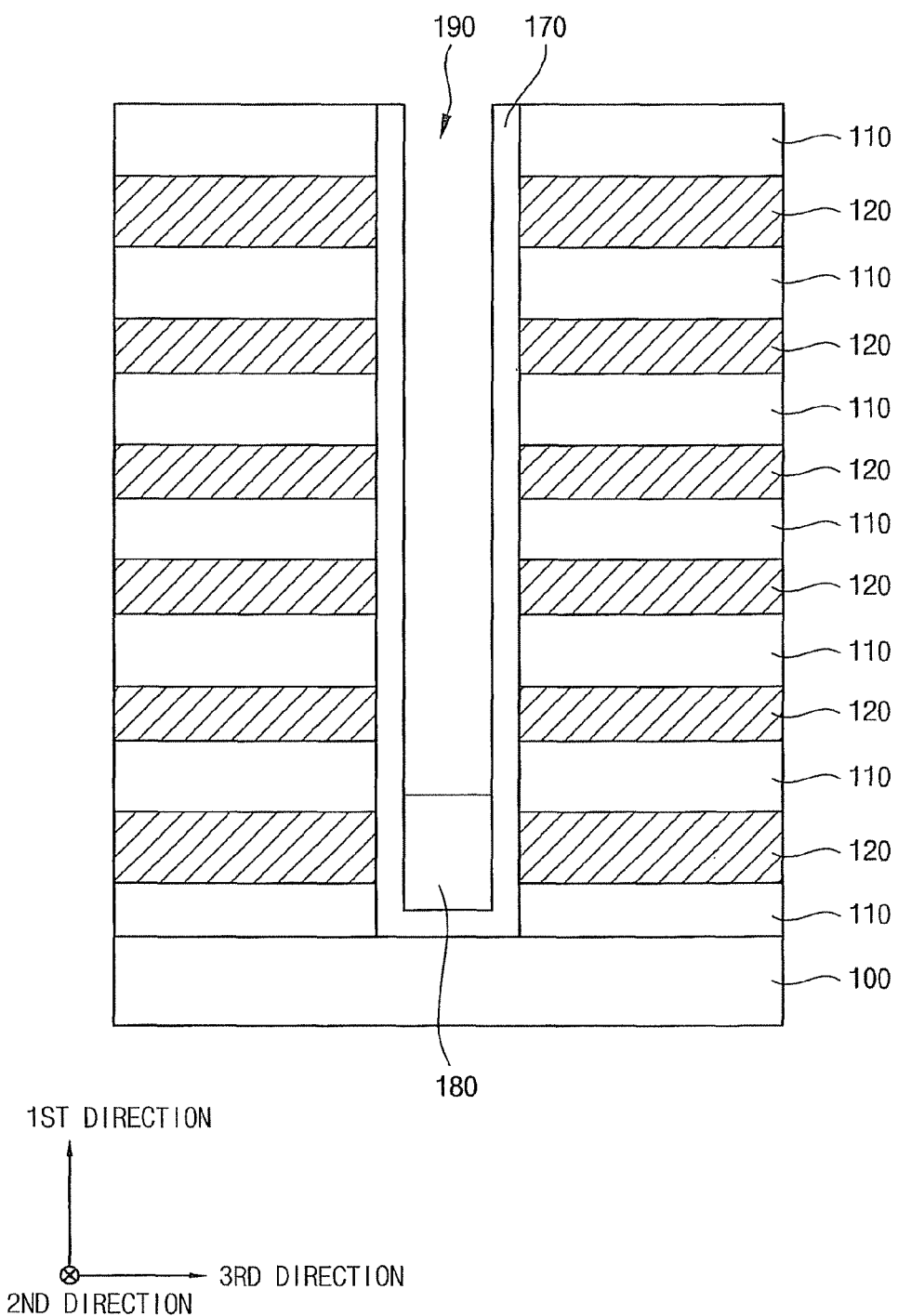

FIGS. 15-21 are cross-sectional diagrams illustrating methods of manufacturing a vertical memory device of FIG. 14 in accordance with example embodiments. The method may include processes substantially the same as or similar to those of FIGS. 2-13 and 1C, and thus detail explanations thereabout may be omitted herein. Referring to FIG. 15, processes substantially the same as or similar to those illustrated with reference to FIGS. 2-4 may be performed so that a first channel layer pattern 170 may be fondled on a sidewall of a first opening (not shown) and a first filling layer pattern 180 filling the remaining portion of the first opening may be formed on the first channel layer pattern 170. The first channel layer pattern 170 may be of a first thickness.

An upper portion of the first filling layer pattern 180 may be removed to form a first recess 190 exposing an upper portion of the first channel layer pattern 170. According to example embodiments, the first recess 190 may be formed to have a bottom higher than a top surface of the sacrificial layer 120 at the level at which a GSL 256 is formed.

Figure 16:
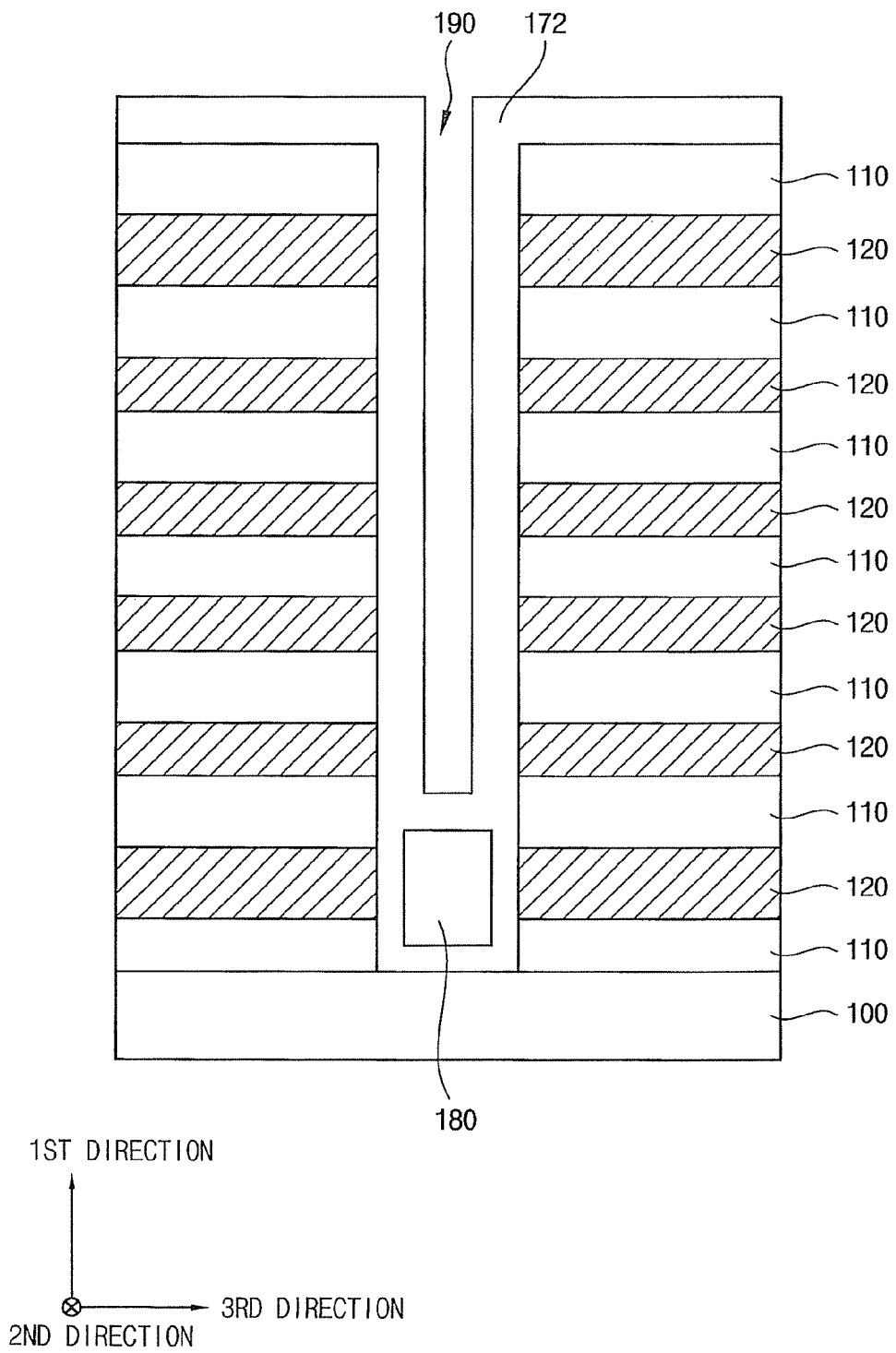

Referring to FIG. 16, a second channel layer 172 may be formed on the first channel layer pattern 170, the first filling layer pattern 180 and the first insulation layer 110. According to example embodiments, the second channel layer 172 may be formed to include, for example, a material substantially the same as that of the first channel layer pattern 170 so that the first channel layer pattern 170 may be merged into the second channel layer 172. A portion of the second channel layer 172 exposed by the resultant first recess 190 may be of a thickness greater than that of the first channel layer pattern 170.

Figure 17:
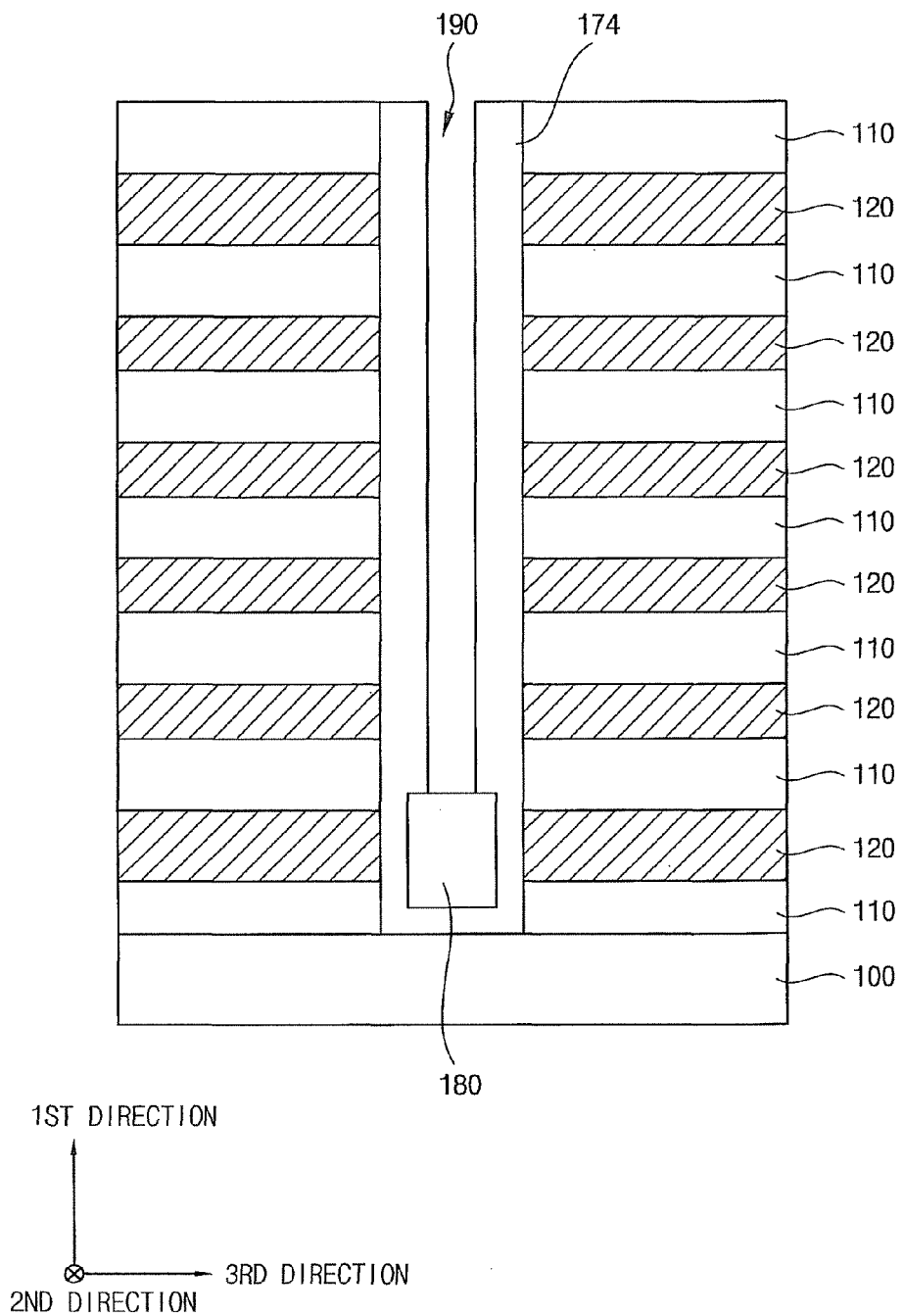

Referring to FIG. 17, the second channel layer 172 may be partially removed until top surfaces of the first insulation layer 110 and the first filling layer pattern 180 are exposed to form a second channel layer pattern 174. According to example embodiments, the second channel layer pattern 174 may be formed by, for example, a CMP process and/or an etch back process.

Figure 18:
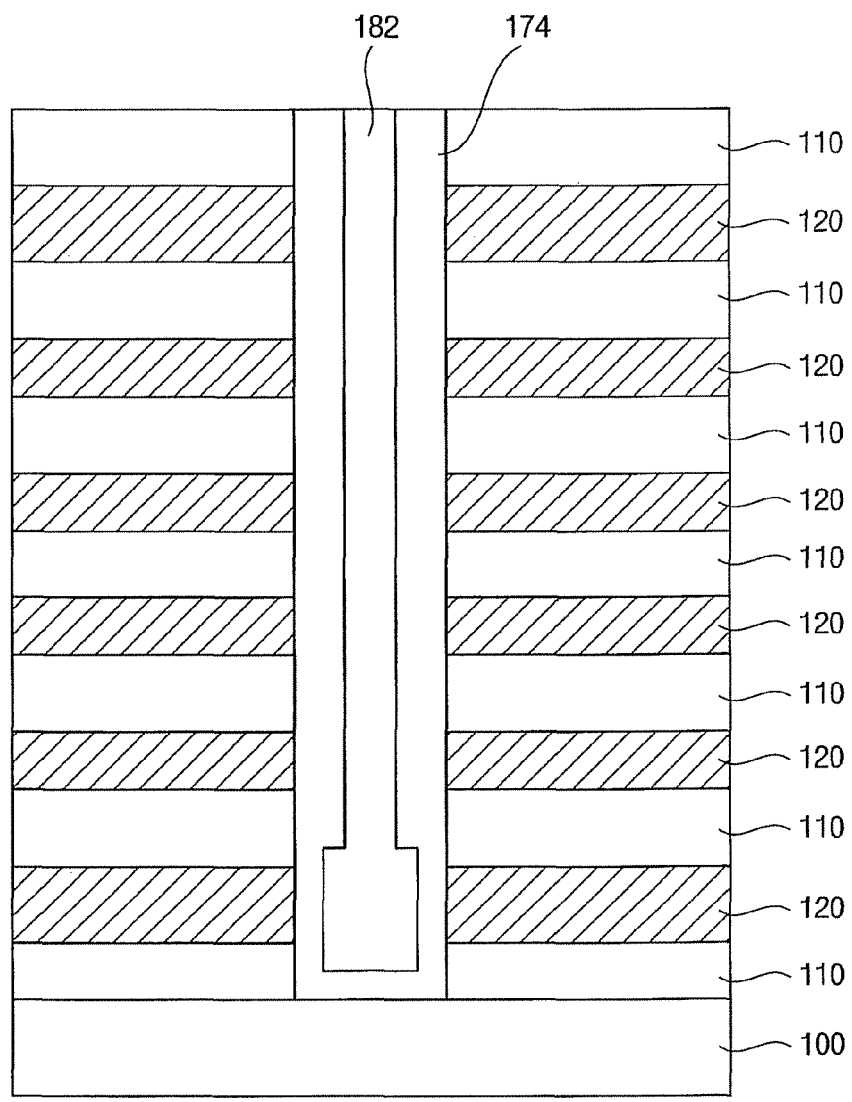
Figure 18:
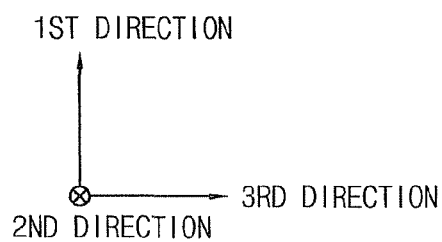

Referring to FIG. 18, a second filling layer pattern 182 may be formed to fill the remaining portion of the first recess 190. A second filling layer filling the remaining portion of the first recess 190 may be formed on the first filling layer pattern 180, the second channel layer pattern 174 and the first insulation layer 110, and an upper portion of the second filling layer may be planarized until a top surface of the first insulation layer 110 is exposed to form the second filling layer pattern 182. According to example embodiments, the second filling layer may be formed using, for example, a material substantially the same as that of the first filling layer pattern 180, thereby being merged into the first filling layer pattern 180 to form the second filling layer pattern 182. According to at least one example embodiment, the second filling layer may be formed to include a material different from that of the first filling layer pattern 180. The planarization process may be performed by, for example, a CMP process.

Figure 19:
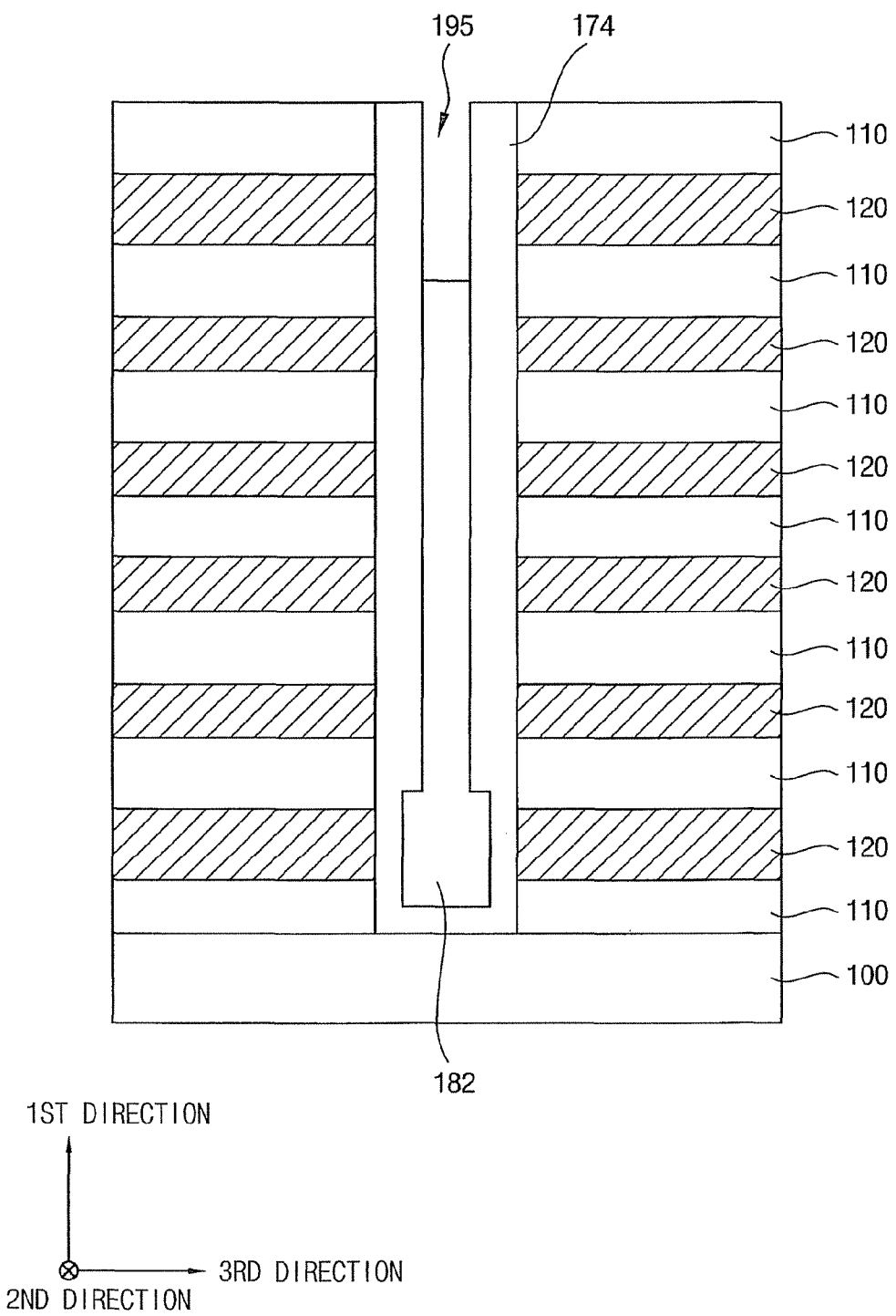

Referring to FIG. 19, a process substantially the same as or similar to that illustrated with reference to FIG. 5 may be performed. An upper portion of the second filling layer pattern 182 may be removed to form a second recess 195 exposing an upper portion of the second channel layer pattern 174. According to example embodiments, the second recess 195 may be formed by, for example, an etch-back process. According to example embodiments, the second recess 195 may be formed with a bottom lower than that of the sacrificial layer 120 at the level at which an SSL 254 may be formed.

Figure 20:
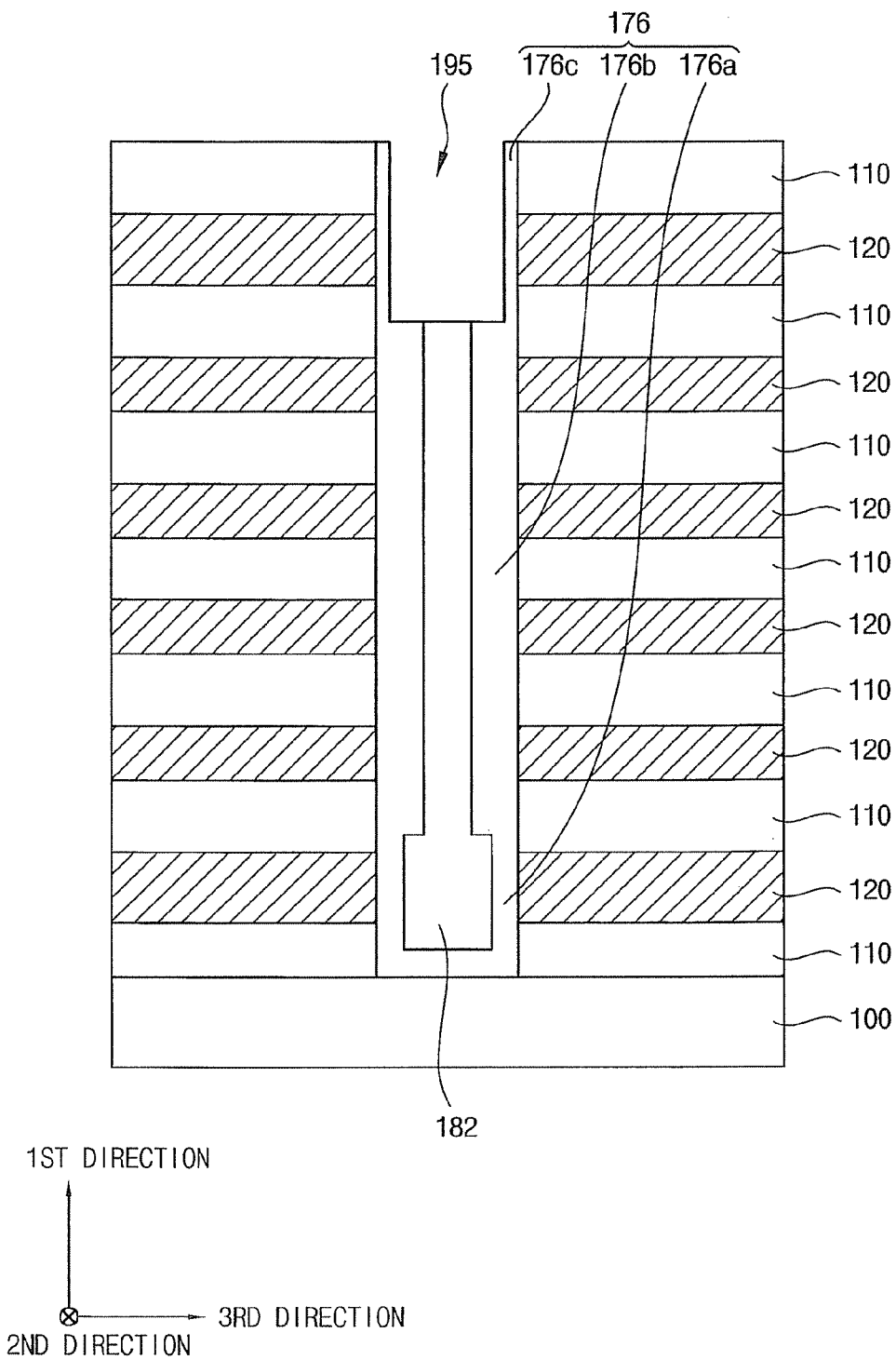

Referring to FIG. 20, a process substantially the same as or similar to that illustrated with reference to FIG. 6 may be performed. An upper portion of the second channel layer pattern 174 may be partially removed to form a channel 176. The channel 176 may include a lower portion 176a of a first thickness, a central portion 176b of a second thickness, and an upper portion 176c of a third thickness. The first and third thicknesses may be substantially the same as each other. According to at least one example embodiment, the first and third thicknesses may be different from each other.

Figure 21:
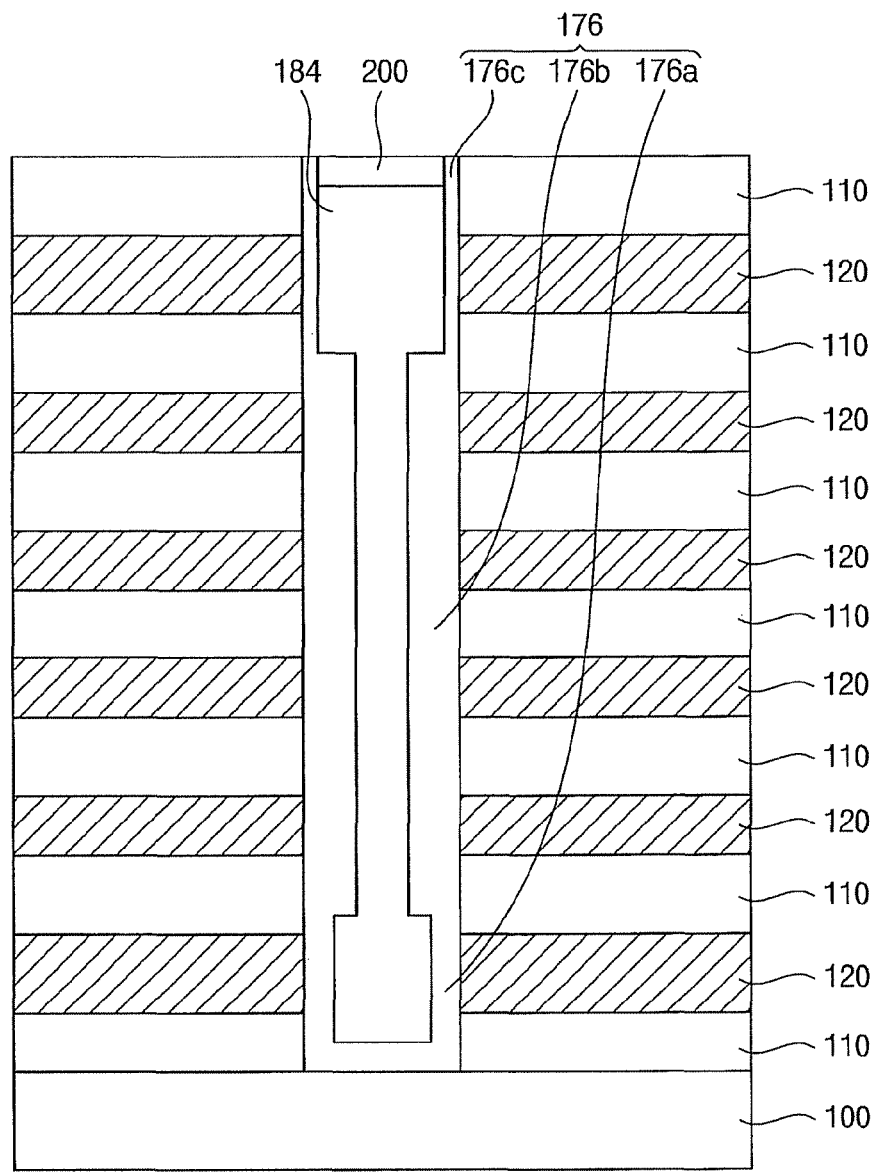

Referring to FIG. 21, processes substantially the same as or similar to those illustrated with reference to FIGS. 7 and 8 may be performed. A third filling layer filling the second recess 195 may be formed on the second filling layer pattern 182, the channel 176 and the first insulation layer 110, and planarized until a top surface of the first insulation layer 110 is exposed. According to example embodiments, the third filling layer may be formed to include, for example, a material substantially the same as that of the second filling layer pattern 182, thereby being merged into the second filling layer pattern 182 to form a third filling layer pattern 184. According to at least one example embodiment, the third filling layer may be formed to include a material different from that of the second filling layer pattern 182. After removing an upper portion of the third filling layer pattern 184, a pad 200 filling the remaining portion of the second recess 195 may be formed.

Referring to FIG. 14, processes substantially the same as or similar to those illustrated with reference to FIGS. 9-13 and 1C may be performed so that a third insulation layer 270, a bit line contact 280 and a bit line 290 may be formed to complete the vertical memory device.

According to example embodiments, after forming the first channel layer pattern 170 of the first thickness on a sidewall of the first opening and forming the first filling layer pattern 180 filling the remaining portion of the first opening, an upper portion of the first filling layer pattern 180 may be removed to form the first recess 190. The second channel layer 172 may be formed on a portion of the first channel layer pattern 170 exposed by the first recess 190 and etched to form the second channel layer pattern 174 of the second thickness greater than the first thickness, and the second filling layer pattern 182 filling the remaining portion of the first recess 190 may be formed. An upper portion of the second filling layer pattern 182 may be removed to form the second recess 195, and an upper portion of the second channel layer pattern 174 exposed by the second recess 195 may be partially removed by a wet etch process to form the channel 176. The channel 176 may include the lower portion 176a of the first thickness, the central portion 176b of the second thickness greater than the first thickness, and the upper portion 176c of the third thickness less than the second thickness.

The exposed upper portion of the first channel layer pattern 140 may be partially removed by a wet etch process to form the channel 142 including the lower and upper portions 142a and 142b of different thicknesses. The upper portion 142b of the channel 142 may be formed to be adjacent to the SSL 254. The lower and upper portions 176a and 176c of the channel 176 of relatively small thicknesses may be formed to be adjacent to the GSL 256 and the SSL 254, respectively.

Figure 22:
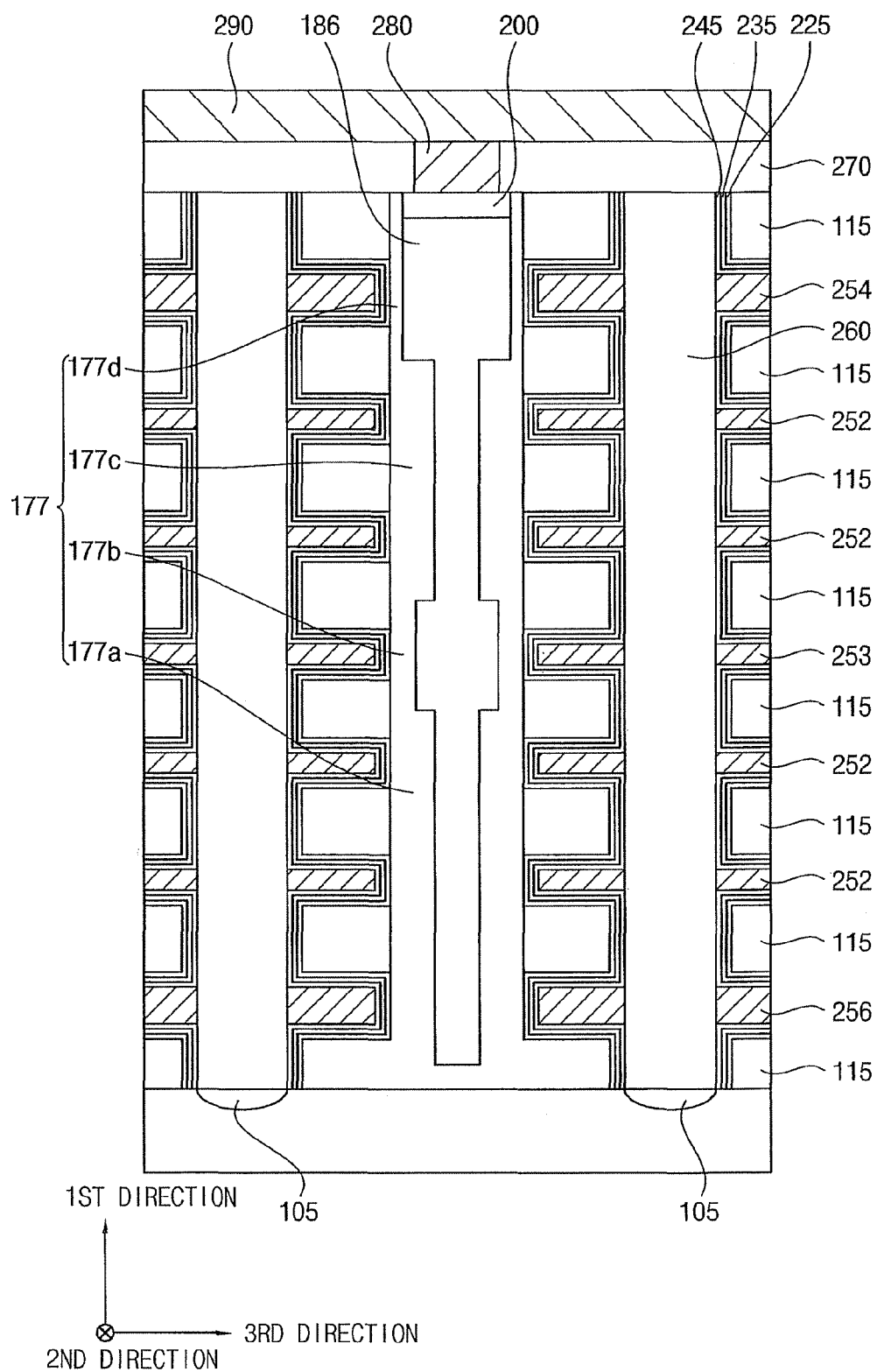

FIG. 22 is a cross-sectional diagram illustrating vertical memory devices in accordance with still other example embodiments. The vertical memory device of FIG. 22 may be substantially the same as or similar to that of FIG. 1, except that the vertical memory device may further include a dummy word line and the shapes of a channel and a filling layer pattern may be different from those of the channel and the filling layer pattern of FIG. 1, and thus repetitive explanations thereabout may be omitted herein.

Referring to FIG. 22, the vertical memory device may include a dummy word line 253. The dummy word line 253 may be between word lines 252. According to at least one example embodiment, the dummy word line 253 may be between the word line 252 and an SSL 254 and/or between the word line 252 and a GSL 256. The dummy word line 253 may include, for example, a metal and/or a metal nitride. The dummy word line 253 may not be involved in the writing/erasing operation but may be involved in a switching operation. A tunnel insulation layer pattern 225, a charge trapping layer pattern 235 and a blocking layer pattern 245 may be between the dummy word line 253 and a sidewall of a channel 177 in a direction substantially perpendicular to the sidewall of the channel 177.

The channel 177 may be cup shaped and/or of a hollow cylindrical shape, and include a lower portion 177a of a first thickness, a first central portion 177b of a second thickness less than the first thickness, a second central portion 177c of a third thickness greater than the second thickness, and an upper portion 177d of a fourth thickness less than the third thickness. The first and third thicknesses may be substantially the same as or different from each other, and the second and fourth thicknesses may be substantially the same as or different from each other. The second and fourth thicknesses may be less than the first and third thicknesses. The first central portion 177b of the channel 177 may be formed adjacent to the dummy word line 253, and the upper portion 177d of the channel 177 may be formed adjacent to the SSL 254.

A fourth filling layer pattern 186 may be in a space defined by an inner sidewall of the channel 177 with the cup shape. The fourth filling layer pattern 186 may include an insulating material, for example, an oxide. The channel 177 may include the lower portion 177a, the first and second central portions 177b and 177c, and the upper portion 177d of the first, second, third and fourth thicknesses, respectively. The fourth filling layer pattern 186 may include a lower portion and a second central portion of relatively small thickness and a first central portion and an upper portion of relatively large thicknesses. According to at least one example embodiment, the lower portion, the first and second central portions and the upper portion of the fourth filling layer pattern 186 may include different materials from one another.

The vertical memory device may include the channel 177 of different thicknesses according to position or height. The channel 177 may include the first central portion 177b and the upper portion 177d of relatively small thicknesses adjacent to the dummy word line 253 and the SSL 254, so that the vertical memory device may have a narrow and/or reduced threshold voltage distribution and a low and/or reduced switching variation. The channel 177 may include the lower portion 177a and the second central portion 177c of relatively large thicknesses adjacent to the word line 252, so that endurance with respect to repetition of writing/erasing operations of the vertical memory device may be good and/or increased.

Figure 23:
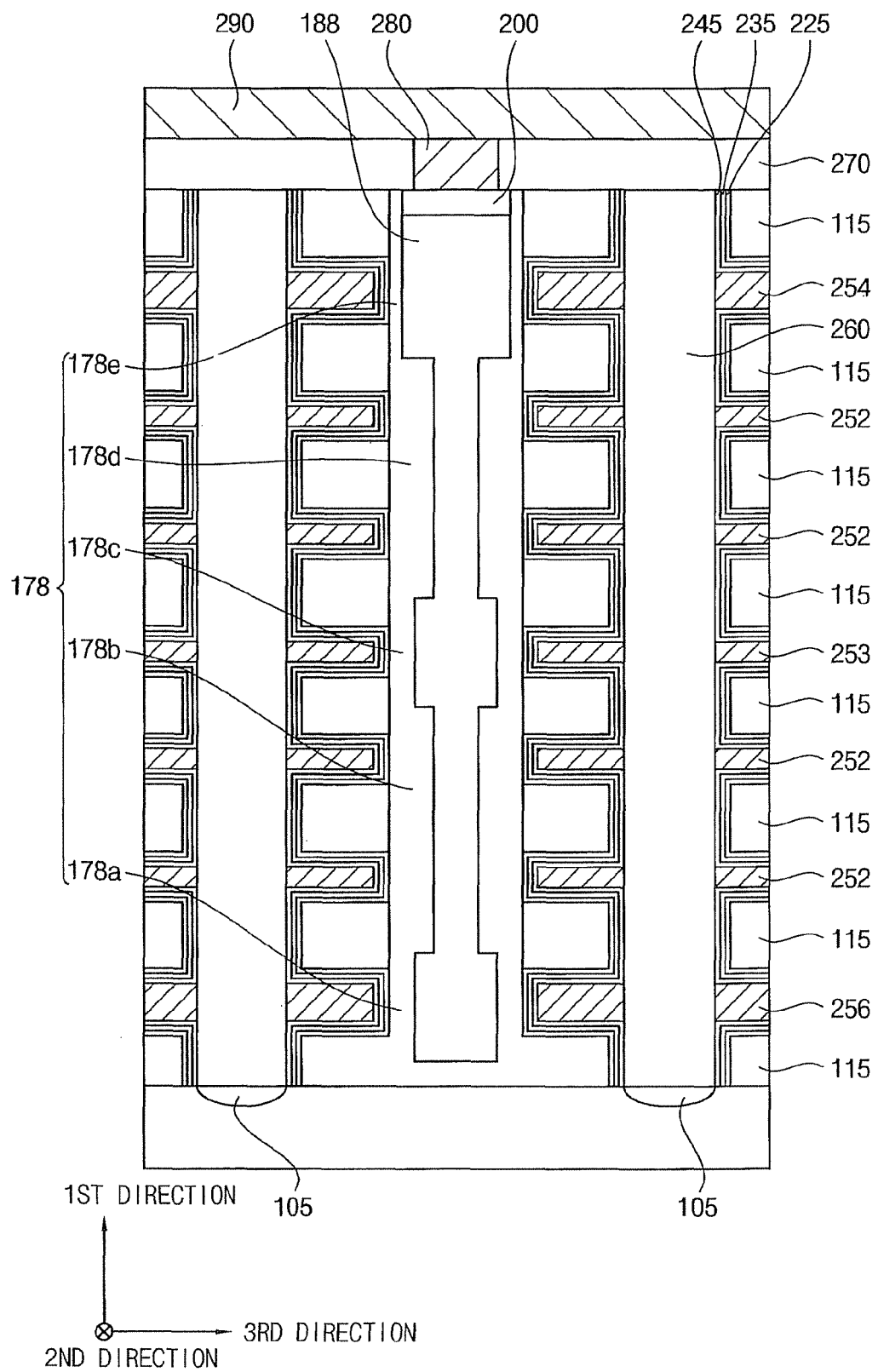

FIG. 23 is a cross-sectional diagram illustrating vertical memory devices in accordance with yet other example embodiments. The vertical memory device of FIG. 23 may be substantially the same as or similar to that of FIG. 22, except for the shapes of a channel and a filling layer pattern, and thus repetitive explanations thereabout may be omitted herein.

Referring to FIG. 23, a channel 178 may be cup shaped and/or of a hollow cylindrical shape, and include a lower portion 178a of a first thickness, a first central portion 178b of a second thickness greater than the first thickness, a second central portion 178c of a third thickness less than the second thickness, a third central portion 178d of a fourth thickness greater than the third thickness, and an upper portion 178e of a fifth thickness less than the fourth thickness. The first, third and fifth thicknesses may be substantially the same as or different from each other, and the second and fourth thicknesses may be substantially the same as or different from each other. The first, third and fifth thicknesses may be less than the second and fourth thicknesses. The lower portion 178a of the channel 178 may be adjacent to a GSL 256, the second portion 178c of the channel 178 may be adjacent to a dummy word line 253, and the upper portion 178e of the channel 178 may be adjacent to an SSL 254.

A fifth filling layer pattern 188 may be in a space defined by an inner sidewall of the channel 178 with, for example, a cup shape. The fifth filling layer pattern 188 may include an insulating material, for example, an oxide. The channel 178 may include the lower portion 178a, the first, second and third central portions 178b, 178c and 178d, and the upper portion 178e of the first, second, third, fourth and fifth thicknesses, respectively, and thus the fifth filling layer pattern 188 may include a lower portion, a second central portion and an upper portion of relatively large thicknesses and a first portion and a third central portion of relatively small thicknesses. According to at least one example embodiment, the lower portion, the first to third central portions and the upper portion of the fifth filling layer pattern 188 may include different materials from one another.

The vertical memory device may include the channel 178 of different thicknesses according to position or height. The channel 178 may include the lower portion 178a, the second central portion 178c and the upper portion 178e of relatively small thicknesses adjacent to the GSL 256, the dummy word line 253 and the SSL 254, so that the vertical memory device may have a narrow and/or reduced threshold voltage distribution and low and/or decreased switching variation. The channel 178 may include the first and third central portions 178b and 178d of relatively large thicknesses adjacent to the word line 252, so that endurance with respect to repetition of writing/erasing operations of the vertical memory device may be good and/or increased.

Figure 24A:
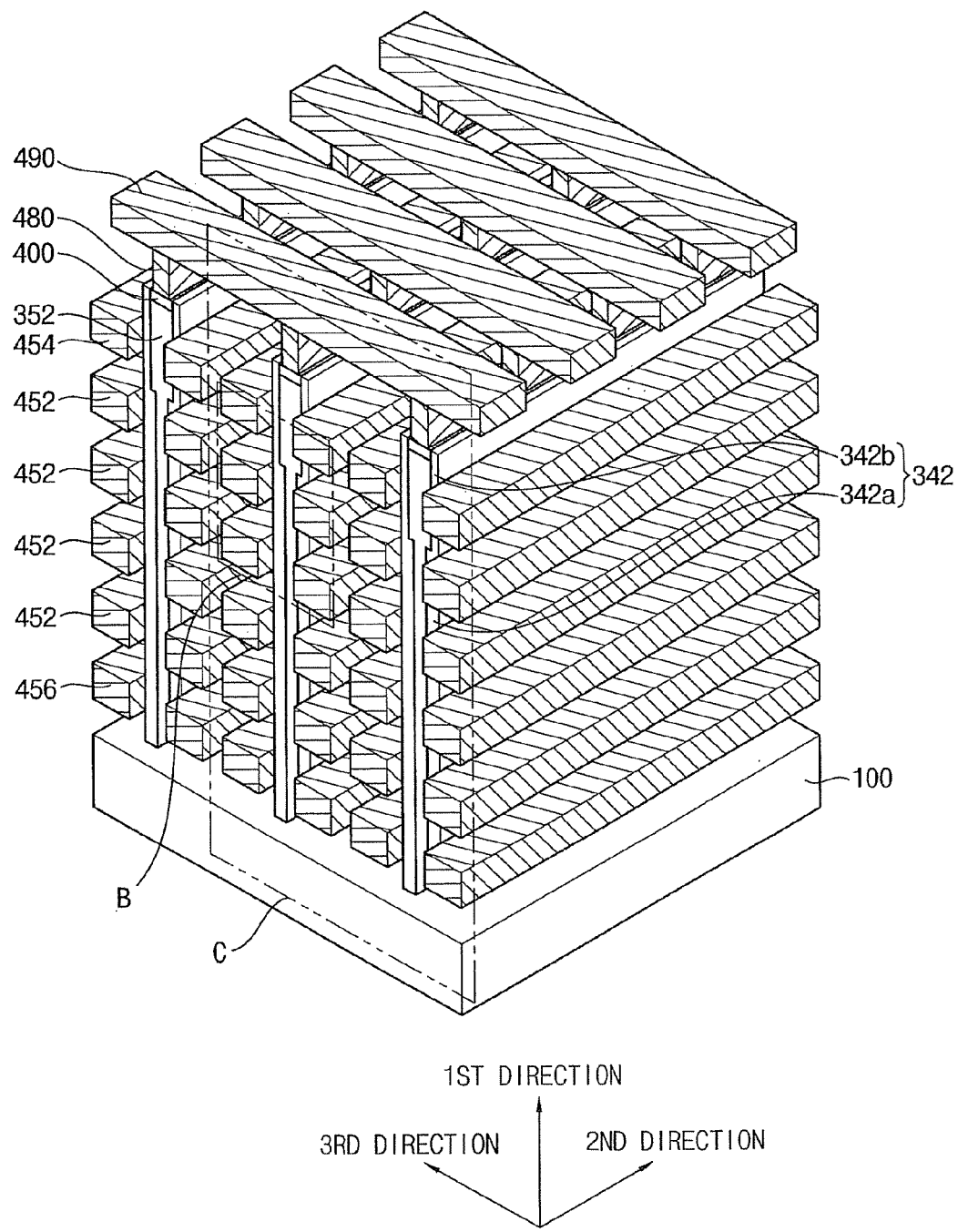
FIGS. 24A and 24B are a perspective diagram and a local perspective view, respectively, illustrating vertical memory devices in accordance with further example embodiments.
Figure 24B:
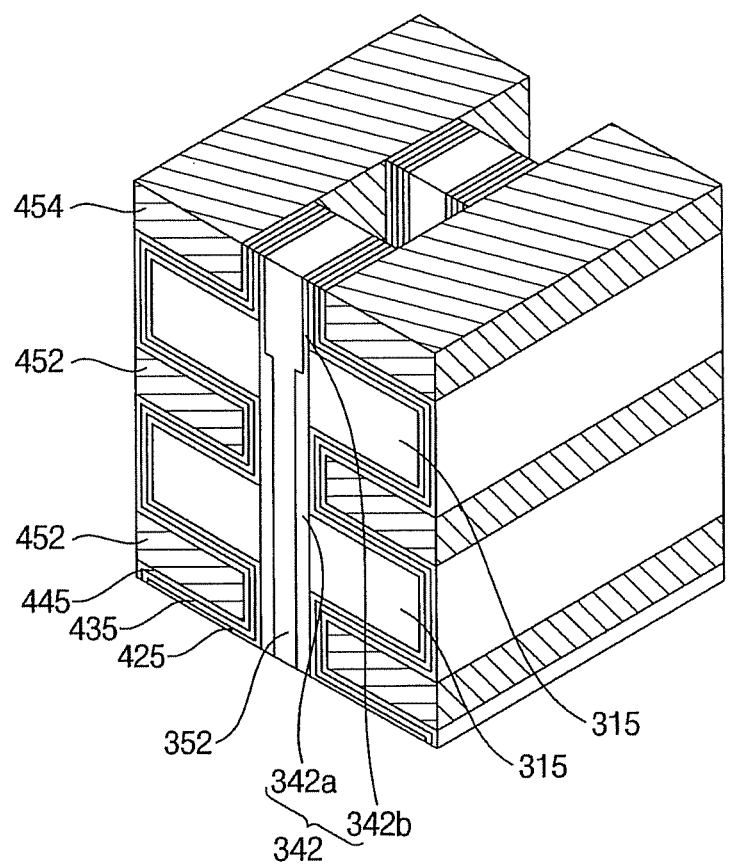

FIGS. 24A and 24B are a perspective diagram and a local perspective diagram, respectively, illustrating vertical memory devices in accordance with further example embodiments. FIG. 24B may be a local perspective view of region B of the vertical memory device in FIG. 24A. The vertical memory device may be substantially the same as that of FIG. 1, except that the vertical memory device may include an insulation layer pattern, and the shapes of a filling layer pattern and a pad may be different from those of the filling layer pattern and the pad of FIG. 1, and thus repetitive explanations may be omitted herein.

Referring to FIGS. 24A and 24B, a vertical memory device may include a channel 342 extending in a first direction substantially perpendicular to a top surface of a substrate 300, and a GSL 456, a word line 452 and an SSL 454 on an outer sidewall of the channel 342 along the first direction. The vertical memory device may include a bit line 490 electrically connected to the channel 342. According to example embodiments, a plurality of channels 342 may be in a second direction substantially parallel to the top surface of the substrate 300 to define a channel column, and a plurality of channel columns may be in a third direction substantially perpendicular to the second direction to define a channel array.

According to example embodiments, the channel 342 may be of a linear and/or bar shape extending in the first direction, and may include a lower portion 342a of a first thickness in the third direction and an upper portion 342b of a second thickness less than the first thickness in the third direction. The upper portion 342b of the channel 342 may be formed adjacent to the SSL 454, and the lower portion 342a of the channel 342 may be formed adjacent to the GSL 456 and the word line 452.

A second filling layer pattern 352 of a pillar shape may be in a space between the channels 342 with the linear shape adjacent to each other in the third direction, particularly, between second sidewalls of the channels 342 on which the GSL 456, the word line 452 and the SSL 454 are not included. The second filling layer pattern 352 may include an insulating material, for example, an oxide. The channel 342 may include the lower and upper portions 342a and 342b of the first and second thicknesses, respectively, and the second filling layer pattern 352 may include a lower portion of a relatively small thickness and an upper portion of a relatively large thickness. According to at least one example embodiment, the lower and upper portions of the second filling layer pattern 352 may include different materials from each other.

A pad 400 may be on the second filling layer pattern 352 to fill the remaining portion of the space between the channels 342, and may electrically connect the channel 342 to a bit line contact 480. A plurality of structures each of which may include two channels 342, the second filling layer pattern 352 and the pad 400 may be insulated from each other by a third insulation layer pattern (not shown) in the second direction. The third insulation layer pattern may be of a pillar shape extending in the first direction. According to example embodiments, a plurality of third insulation layer patterns may be in the second direction to define a third insulation layer pattern column, and a plurality of third insulation layer pattern columns may be formed in the third direction to define a third insulation layer pattern array.

A tunnel insulation layer pattern 425, a charge trapping layer pattern 435 and a blocking layer pattern 445 may be between each of the GSL 456, the word line 452 and the SSL 454, and a first sidewall of the channel 342 in the third direction. The tunnel insulation layer pattern 425, the charge trapping layer pattern 435 and the blocking layer pattern 445 may be between each of the GSL 456, the word line 452 and the SSL 454, and the first insulation layer pattern 315 and/or on a sidewall of the first insulation layer pattern 315. According to at least one example embodiment, the tunnel insulation layer pattern 425 may be only on the first sidewall of the channel 342.

A second insulation layer pattern (not shown) may be foiled between structures each of which may include the GSL 456, the word line 452 and the SSL 454 extending in the second direction and the first insulation layer pattern 315 therebetween. An impurity region 305 (refer to FIG. 34) may be at an upper portion of the substrate 300 beneath the second insulation layer pattern, which may extend in the second direction and serve as a CSL.

The bit line 490 may be electrically connected to the pad 400 via the bit line contact 480, and may be electrically connected to the channel 342. According to example embodiments, the bit line 490 may extend in the third direction. The bit line contact 480 may be contained in a third insulation layer (refer to FIG. 34), and contact the pad 400. The third insulation layer 470 may be formed on the first, second and third insulation layer patterns 315, 460 and 465, the channel 342, the pad 400, the blocking layer pattern 445, the charge trapping layer pattern 435 and the tunnel insulation layer pattern 425.

Figure 24B:
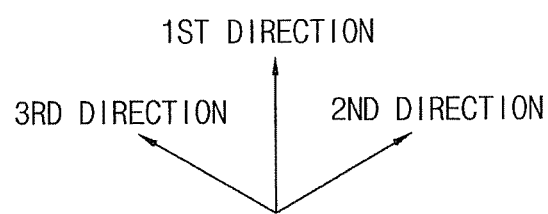
Figure 25:
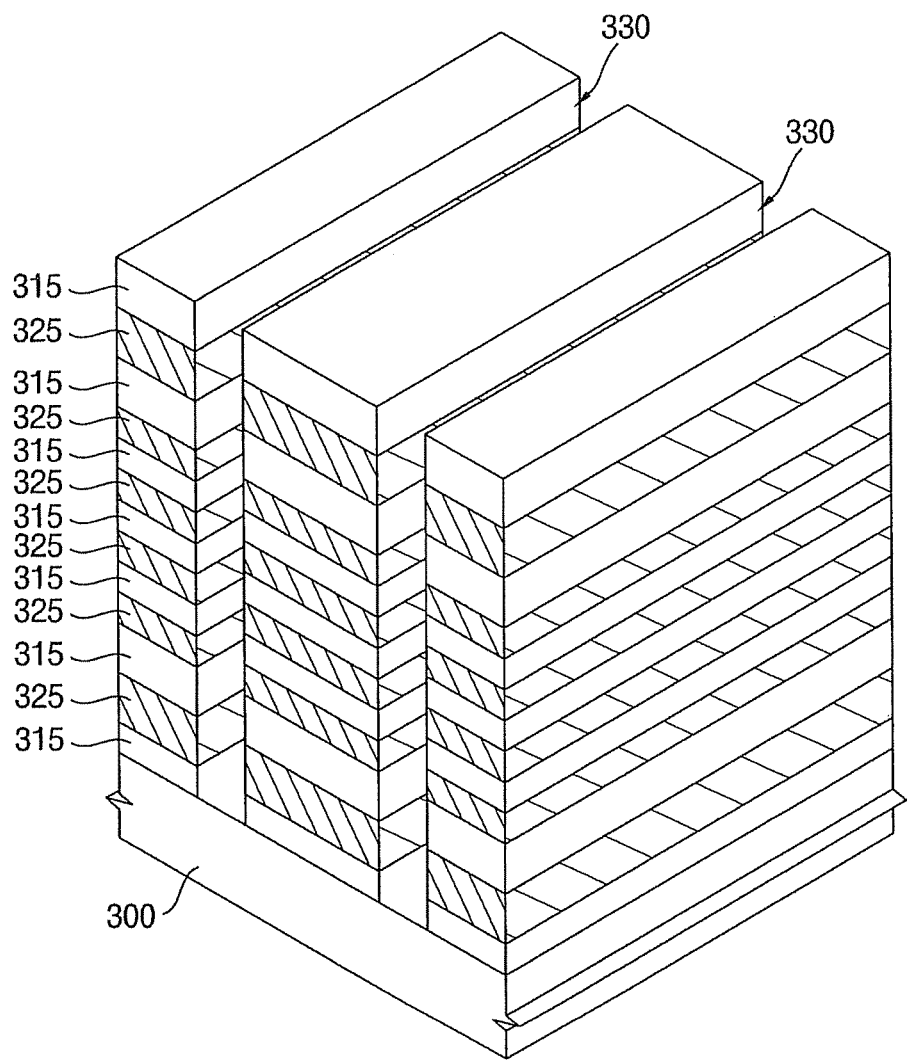
Figure 25:
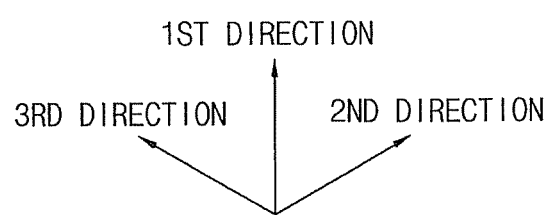

FIGS. 25-34 are perspective diagrams illustrating methods of manufacturing a vertical memory device of FIG. 24 in accordance with example embodiments. The method may include processes substantially the same as or similar to those of FIGS. 2-13 and 1C, and thus detail explanations may be omitted herein. Referring to FIG. 25, processes substantially the same as or similar to those illustrated with reference to FIGS. 2 and 3 may be performed. A first insulation layer and a sacrificial layer may be alternately and repeatedly formed on a substrate 300, and a first opening 330 extending in a first direction substantially perpendicular to a top surface of the substrate 300 may be formed through the first insulation layer and the sacrificial layer to expose the substrate 300.

The first opening 330 may not be of an island shape but may extend in a second direction substantially parallel to the top surface of the substrate 300. According to example embodiments, a plurality of first openings 330 may be formed in a third direction substantially perpendicular to the second direction. The first insulation layer and the sacrificial layer may be transformed into a first insulation layer pattern 315 and a sacrificial layer pattern 325. Each first insulation layer pattern 315 and each sacrificial layer pattern 325 in each level may extend in the second direction. According to example embodiments, a plurality of first insulation layer patterns 315 and a plurality of sacrificial layer patterns 325 may be formed in the third direction at each level (e.g., each level or height may include one of the first insulation layer patterns 315 and sacrificial layer patterns 325).

Figure 26:
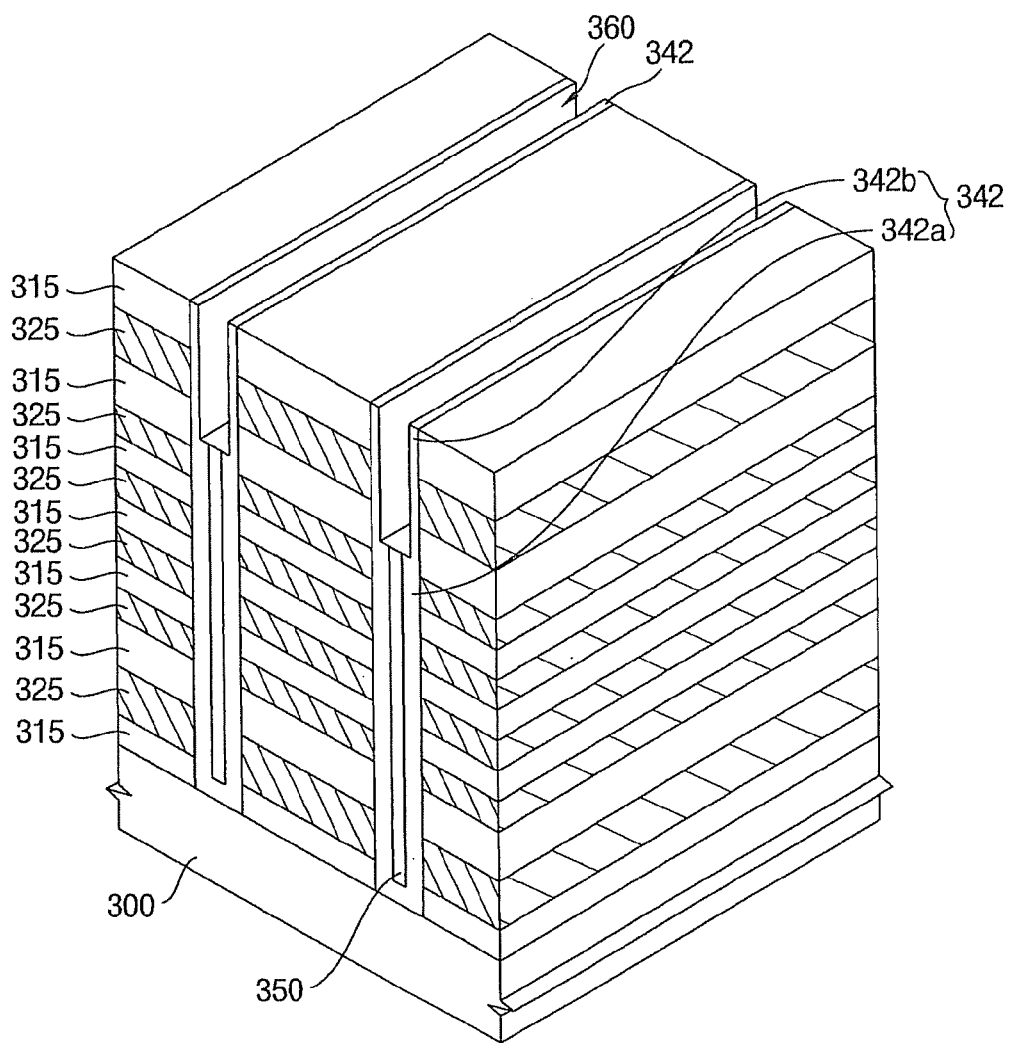
Figure 26:
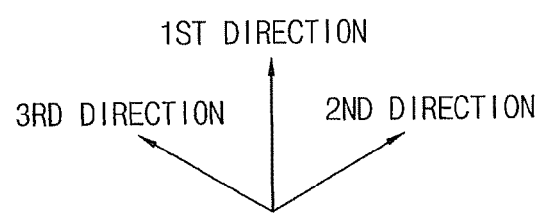

Referring to FIG. 26, processes substantially the same as or similar to those illustrated with reference to FIGS. 4-6 may be performed. A channel 342 including a lower portion 342a of a first thickness and an upper portion 342b of a second thickness less than the first thickness may be formed, and a first filling layer pattern 350 partially filling the first opening 330 may be formed adjacent to the lower portion 342a of the channel 342. The upper portion 342b of the channel 342 may be formed adjacent to the sacrificial layer 320 at the level at which an SSL 454 may be foamed. A first recess 360 may be defined by the upper portion 342b of the channel 342 and the first filling layer pattern 350.

Figure 27:
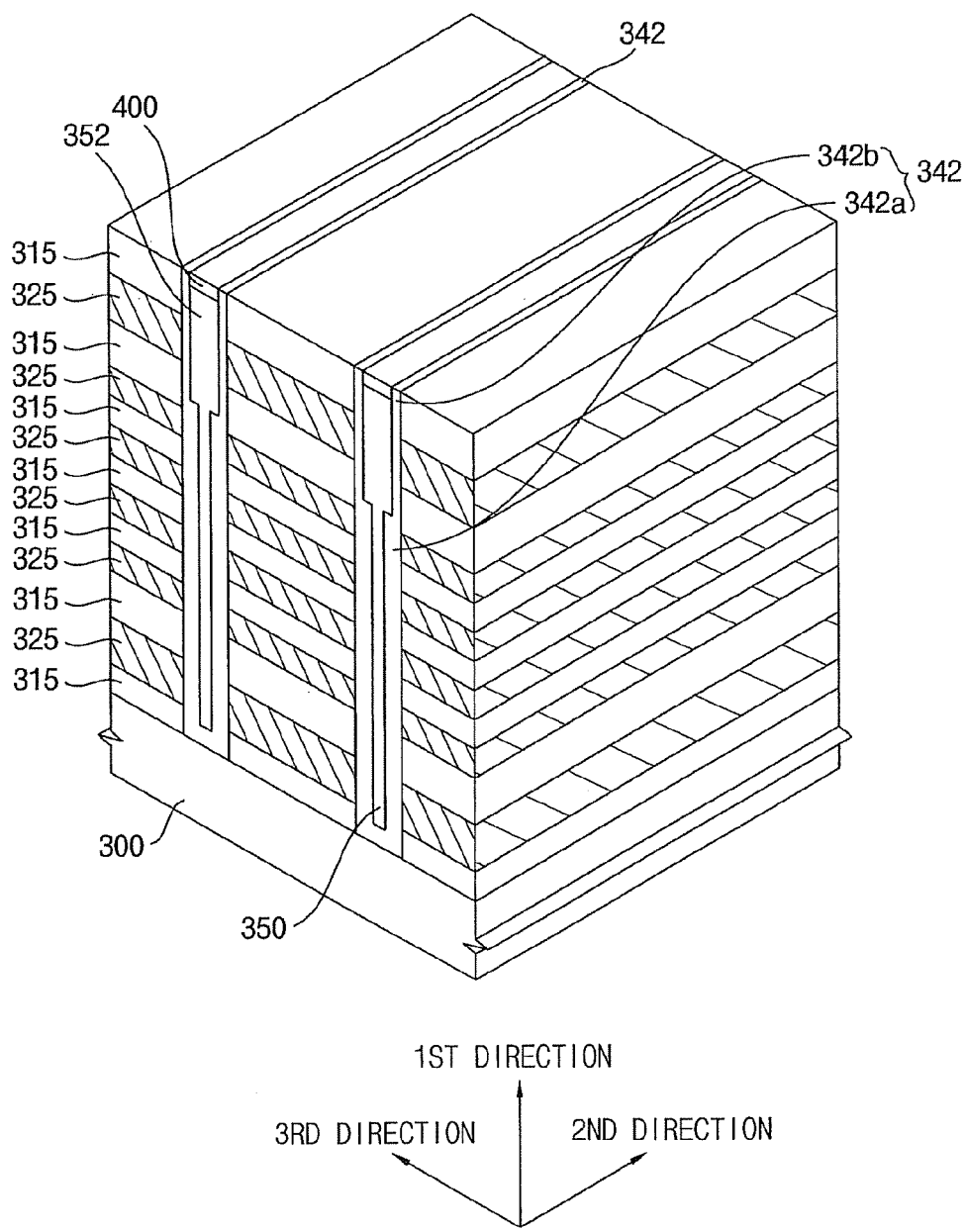

Referring to FIG. 27, processes substantially the same as or similar to those illustrated with reference to FIGS. 7 and 8 may be performed. A second filling layer pattern 352 partially filling the first opening 330 and the first recess 360 may be formed, and a pad 400 may be foamed on the second filling layer pattern 352.

Figure 28:
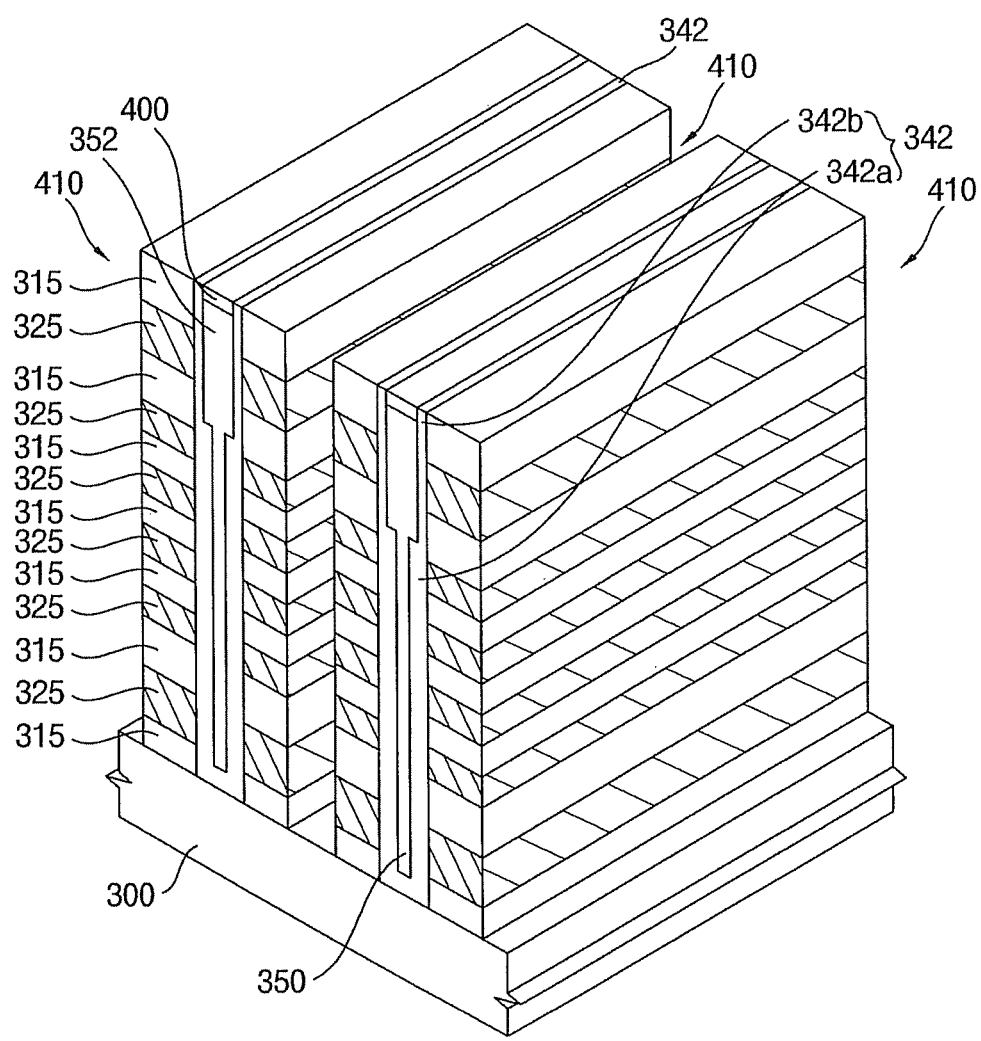
Figure 29:
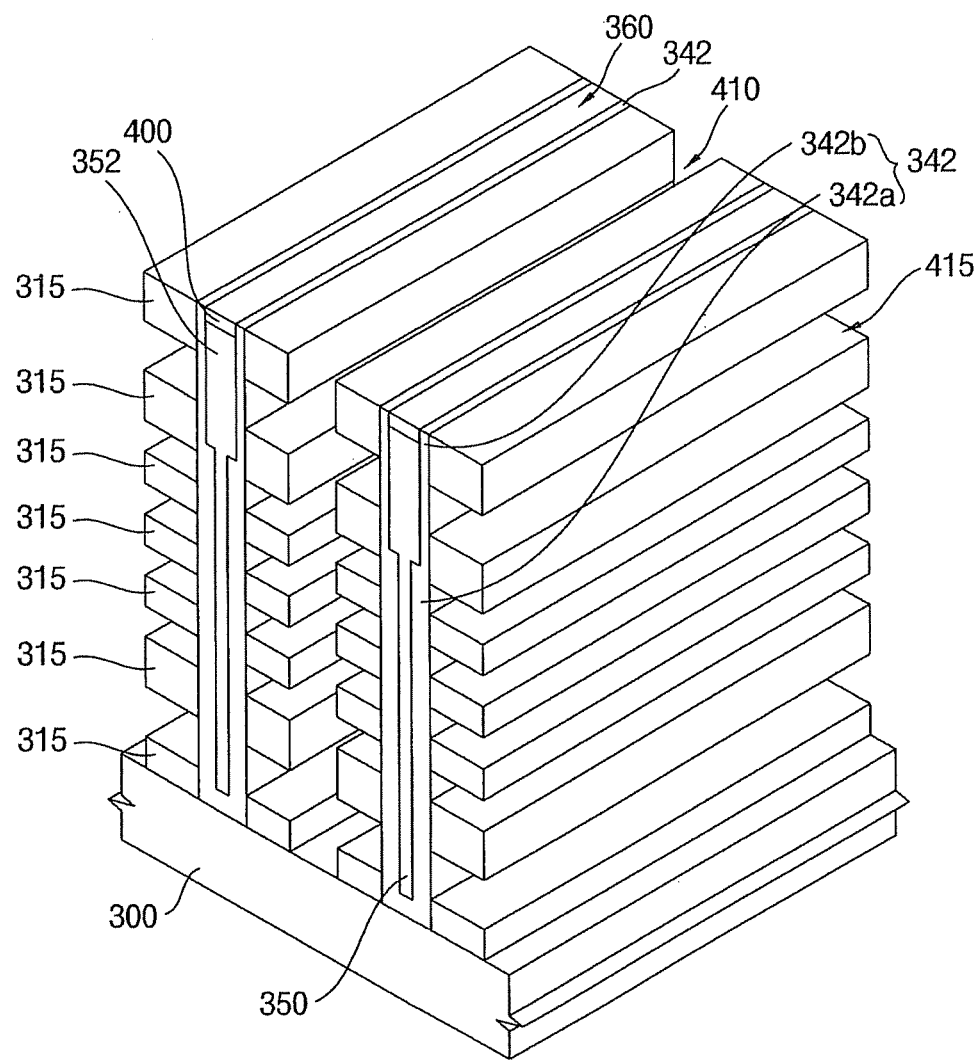
Figure 29:
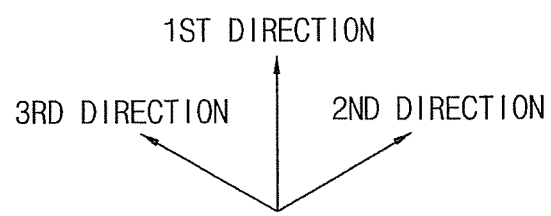

Referring to FIG. 28, a second opening 410 may be formed through the first insulation layer pattern 315 and the sacrificial layer pattern 325 to expose a top surface of the substrate 300. According to example embodiments, a plurality of second openings 410 may be formed in the third direction, and each second opening 410 may extend in the second direction. Referring to FIG. 29, processes substantially the same as or similar to those illustrated with reference to FIG. 10 may be performed. The sacrificial layer pattern 325 may be removed to form a gap 415 between the first insulation layer patterns 315 at a plurality of levels.

Figure 30:
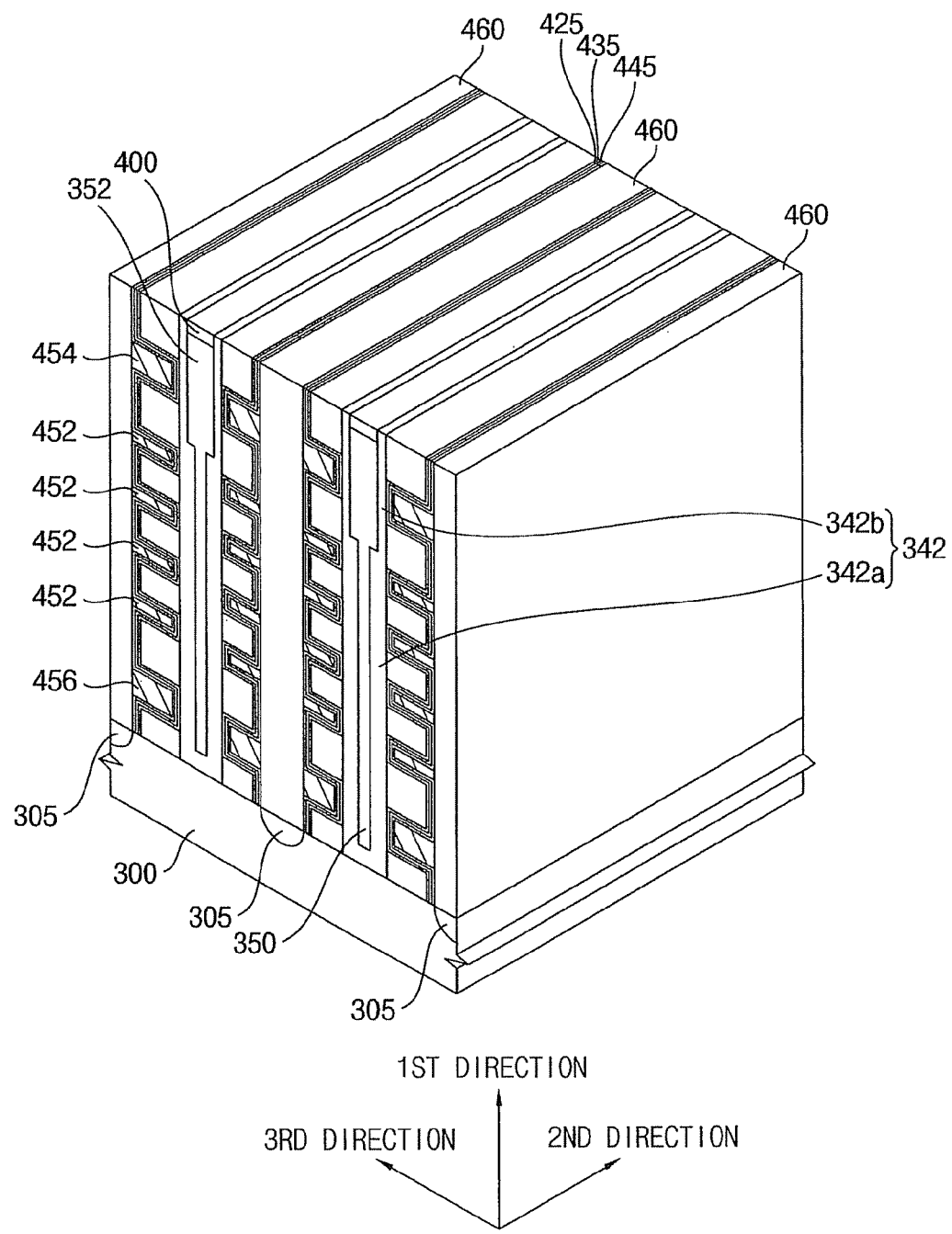

Referring to FIG. 30, processes substantially the same as or similar to those illustrated with reference to FIGS. 11-13 may be performed. A tunnel insulation layer pattern 425, a charge trapping layer pattern 435 and a blocking layer pattern 445 may be sequentially formed on an inner wall of the gap 415 and a sidewall of the first insulation layer pattern 315, and a GSL 456, a word line 452 and the SSL 454 may be formed at a remaining portion of the gap 415.

An impurity region 305 serving as a CSL may be formed at an upper portion of the substrate 300 exposed by a third opening (not shown) extending in the second direction between a plurality of structures each of which may include the GSL 456, the word line 452, the SSL 454 and the first insulation layer pattern 315, and a second insulation layer pattern 460 filling the third opening and extending in the second direction may be formed. According to example embodiments, a plurality of second insulation layer patterns 460 may be formed in the third direction.

Figure 31:
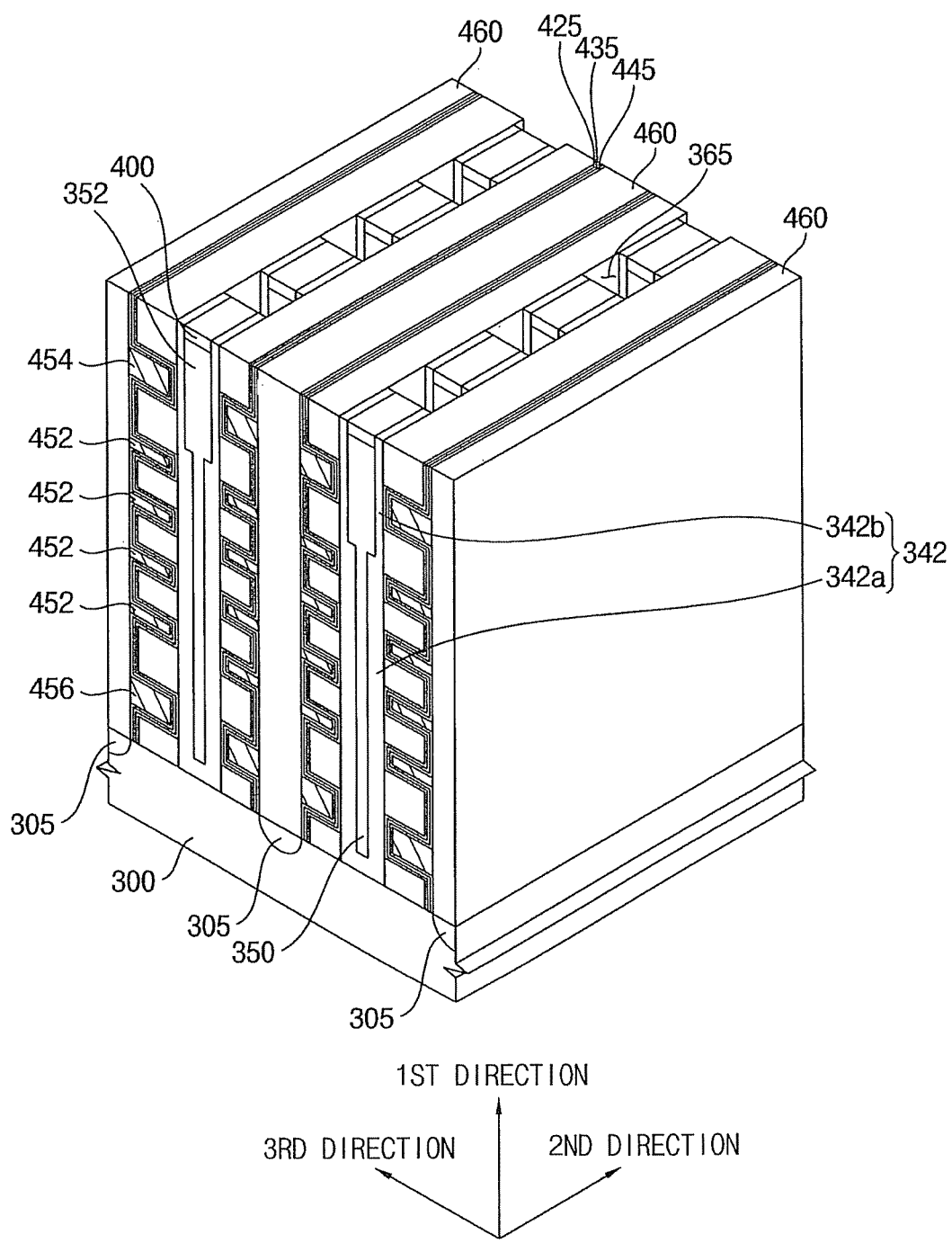

Referring to FIG. 31, the channel 342, the pad 400 and the second filling layer pattern 352 may be partially removed to form a fourth opening 365 exposing a top surface of the substrate 300 and extending in the first direction. According to example embodiments, a plurality of fourth openings 365 of an island shape may be formed in the second direction to define a fourth opening column, and a plurality of fourth opening columns may be formed in the third direction to define a fourth opening array.

Figure 32:
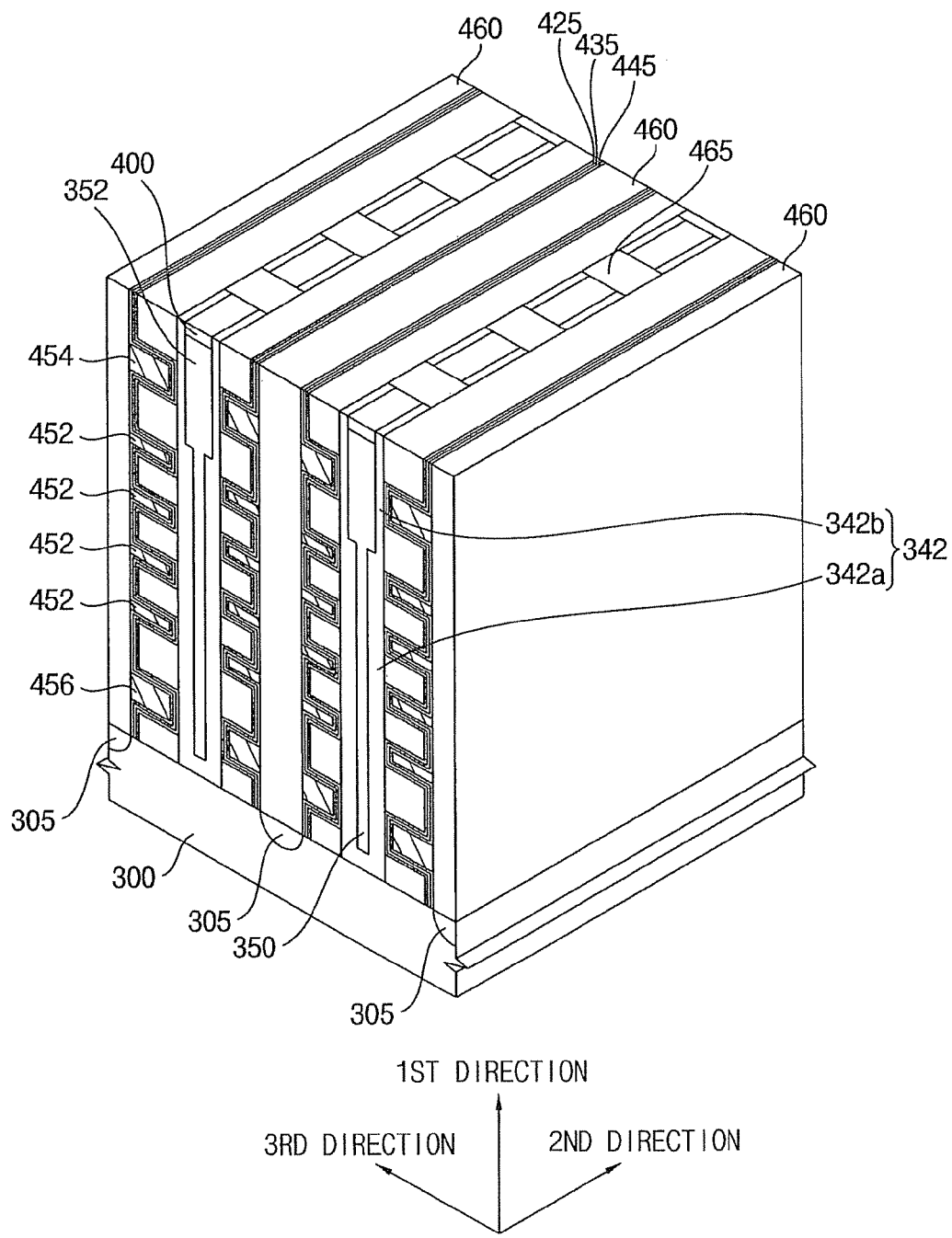

Referring to FIG. 32, a third insulation layer pattern 465 may be formed in the fourth opening 365. A third insulation layer filling the fourth opening 365 may be formed on the substrate 300, the first and second insulation layer patterns 315 and 460, the pad 400, the channel 342, the blocking layer pattern 445, the charge trapping layer pattern 435 and the tunnel insulation layer pattern 425. The third insulation layer pattern may be planarized until a top surface of the first insulation layer pattern 315 is exposed to form the third insulation layer pattern 465. According to example embodiments, the third insulation layer may be formed to include an insulating material, for example, an oxide.

Figure 33:
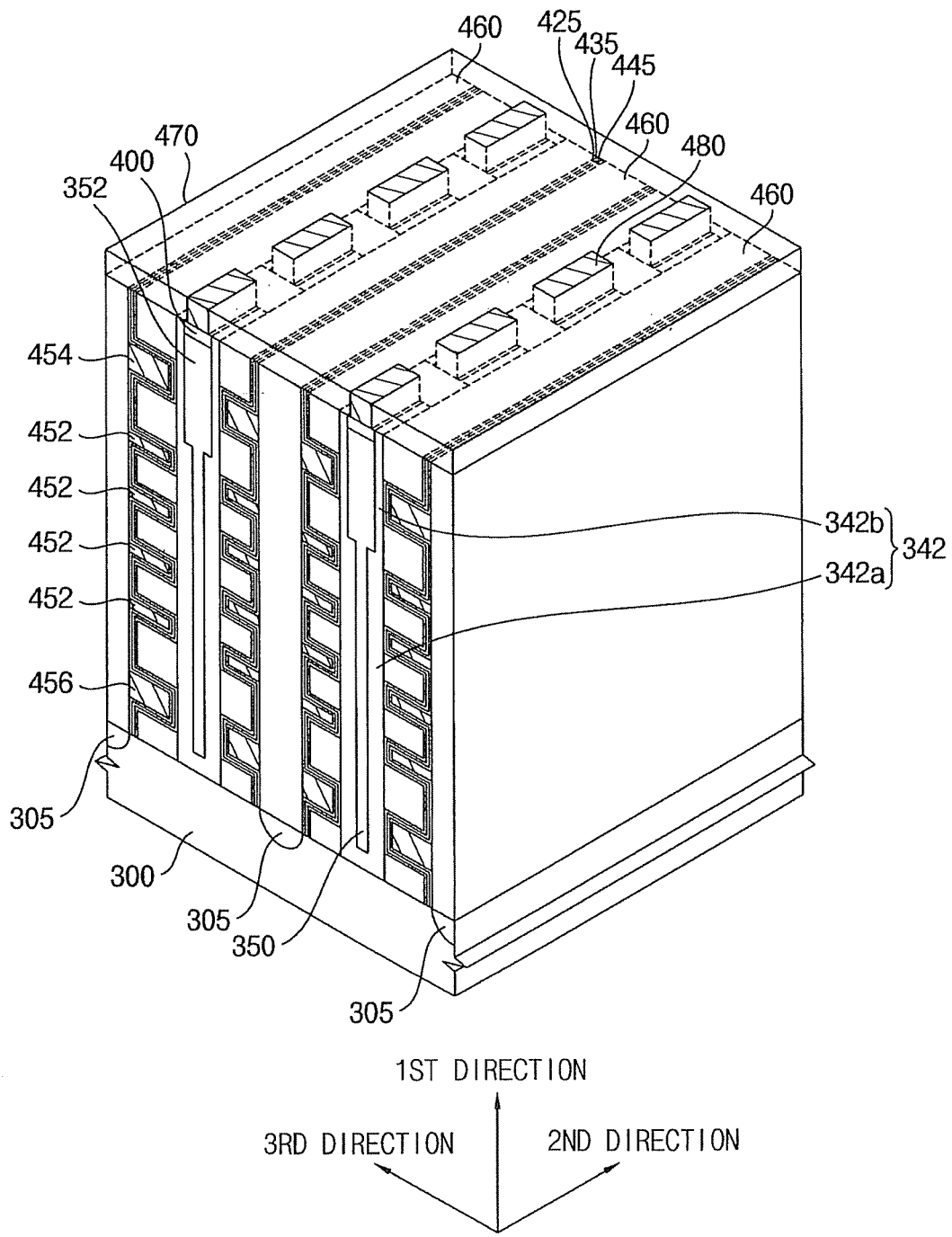

Referring to FIG. 33, a fourth insulation layer 470 may be formed on the first to third insulation layer patterns 315, 460 and 465, the channel 342, the pad 400, the blocking layer pattern 445, the charge trapping layer pattern 435 and the tunnel insulation layer pattern 425, and a fifth opening (not shown) may be formed to expose a top surface of the pad 400. According to example embodiments, a plurality of fifth openings may be formed in the second direction to define a fifth opening column, and a plurality of fifth opening columns may be formed in the third direction to define a fifth opening array.

Figure 34:
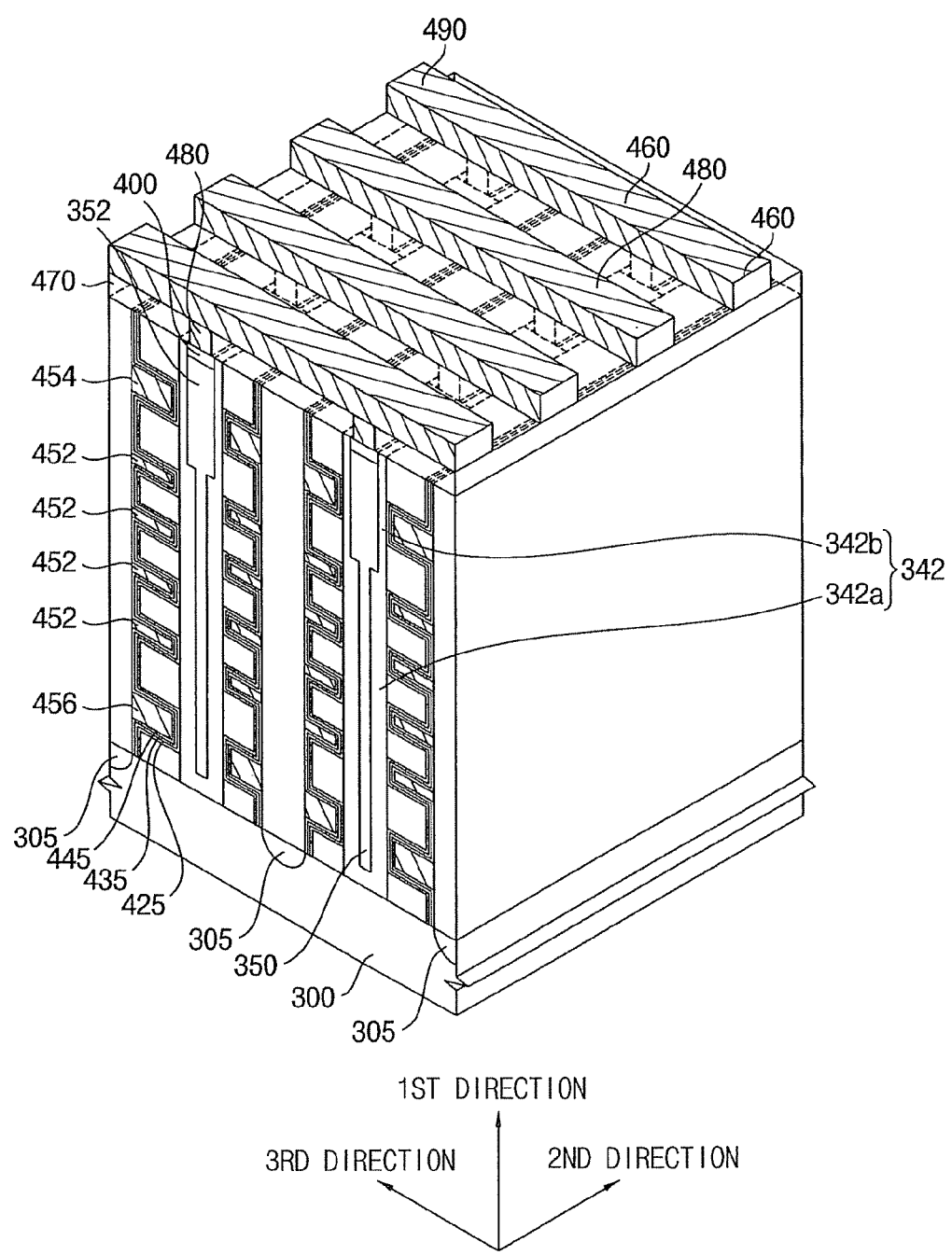

A bit line contact 480 may be formed on the pad 400 to fill the fifth opening. The bit line contact 480 may be formed to include, for example, a metal, a metal nitride and/or doped polysilicon. According to example embodiments, a bit line contact column and a bit line contact array corresponding to the fifth opening column and the fifth opening array, respectively, may be formed. Referring to FIG. 34, a bit line 490 electrically connected to the bit line contact 480 may be formed to complete the vertical memory device. The bit line 490 may be formed to include, for example, a metal, a metal nitride and/or doped polysilicon. According to example embodiments, the bit line 490 may be formed to extend in the third direction.

Figure 35:
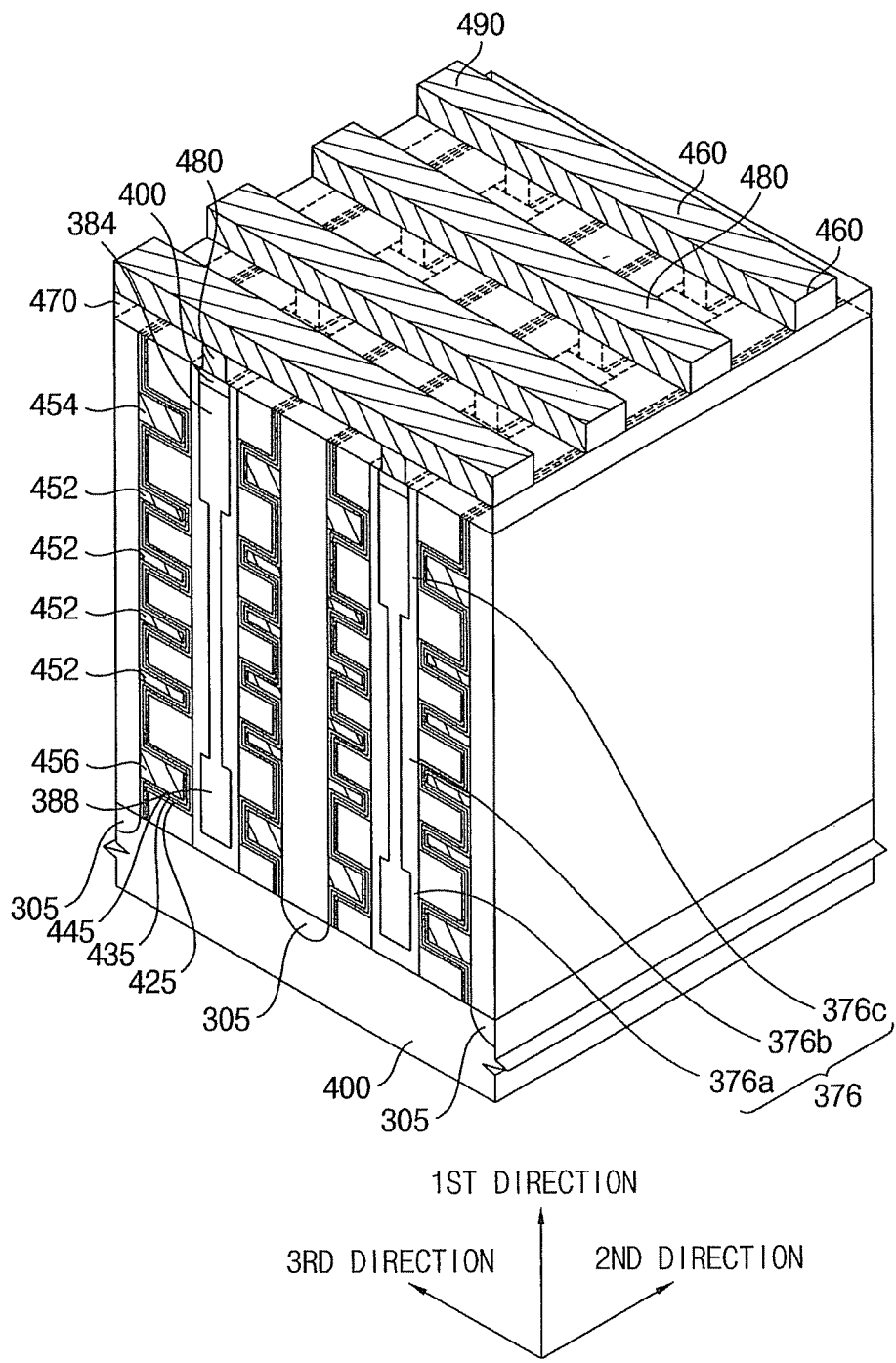

FIG. 35 is a perspective diagram illustrating vertical memory devices in accordance with still further example embodiments. The vertical memory device of FIG. 35 may be substantially the same as or similar to that of FIG. 24 except for the shapes of a channel and a filling layer pattern, and the shapes of the channel and the filling layer pattern may be substantially the same as or similar to those of FIG. 14. Thus, repetitive explanations thereabout may be omitted herein.

Referring to FIG. 35, a channel 376 with a cup shape and/or a hollow cylindrical shape may include a lower portion 376a of a first thickness, a central portion 376b of a second thickness greater than the first thickness, and an upper portion 376c of a third thickness less than the second thickness. The upper portion 376c of the channel 376 may be formed adjacent to the SSL 454, the central portion 376b of the channel 376 may be formed adjacent to the word line 452, and the lower portion 376a of the channel 376 may be formed adjacent to the GSL 456.

A third filling layer pattern 384 may be formed in a space between channels 376 of a linear shape adjacent to each other in a third direction substantially parallel to a top surface of a substrate 300. The channel 376 may include the lower, central and upper portions 376a, 376b and 376c of the first, second and third thicknesses, respectively, and thus the third filling layer pattern 384 may include lower and upper portions of relatively small thicknesses and a central portion of a relatively large thickness.

Figure 36:
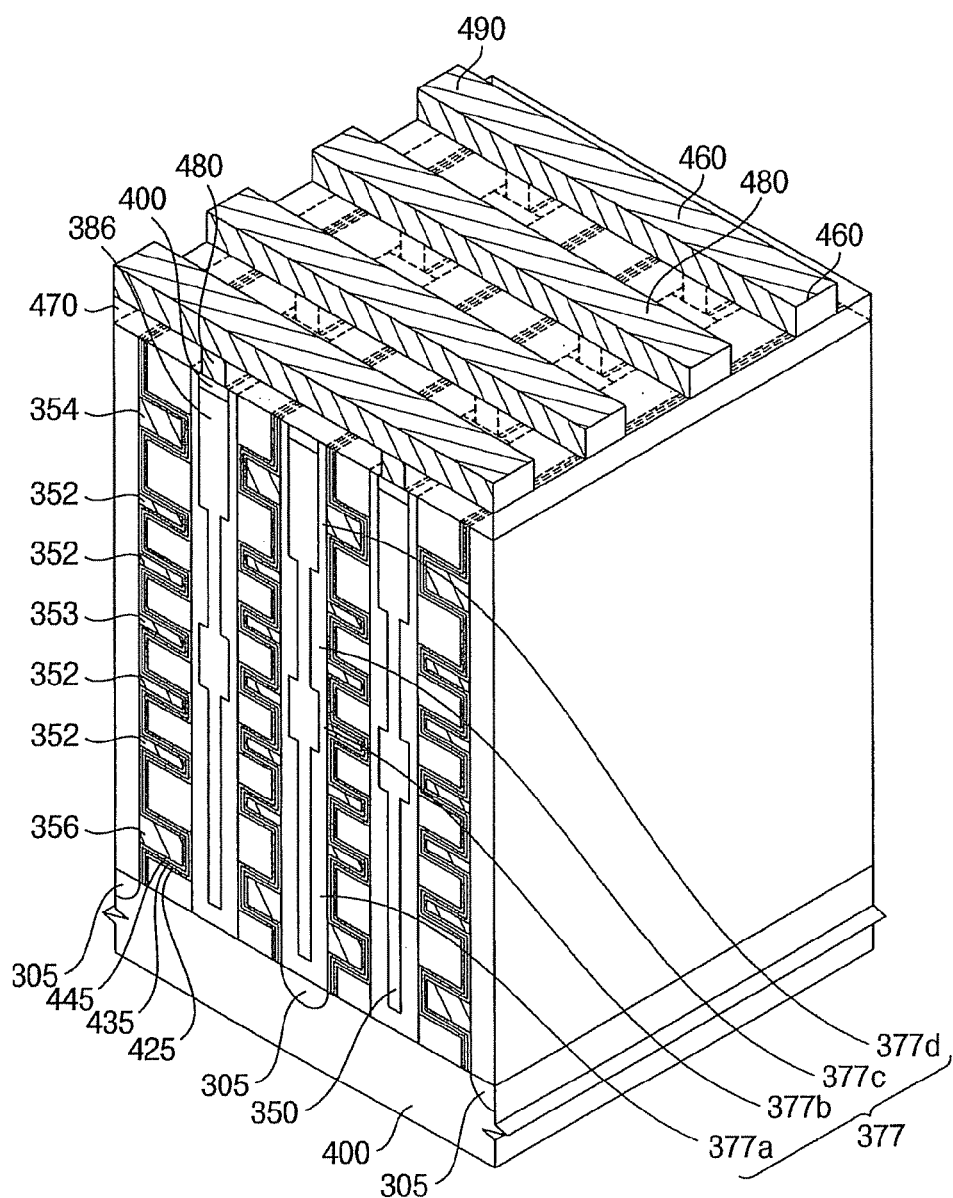

FIG. 36 is a perspective diagram illustrating vertical memory device in accordance with even further example embodiments. The vertical memory device of FIG. 36 may be substantially the same as or similar to that of FIG. 24, except that the vertical memory device may include a dummy word line and the shapes of a channel and a filling layer pattern may be different from those of the channel and the filling layer pattern of FIG. 24, and the dummy word line and the shapes of the channel and the filling layer pattern may be substantially the same as those of FIG. 22. Thus, repetitive explanations may be omitted herein.

Referring to FIG. 36, a vertical memory device may include a dummy word line 353 extending in a second direction substantially parallel to a top surface of a substrate 300. According to example embodiments, a plurality of dummy word lines 353 may be formed in a third direction substantially perpendicular to the second direction.

A channel 377 may be of a linear and/or bar shape extending in a first direction substantially perpendicular to the top surface of the substrate 300, and may include a lower portion 377a of a first thickness, a first central portion 377b of a second thickness less than the first thickness, a second central portion 377c of a third thickness greater than the second thickness, and an upper portion 377d of a fourth thickness less than the third thickness. The first central portion 377b of the channel 377 may be fanned adjacent to the dummy word line 353, and the upper portion 377d of the channel 377 may be formed adjacent to an SSL 454.

A fourth filling layer pattern 386 may be formed in a space between channels 376 having a linear shape adjacent to each other in the third direction. The channel 377 may include the lower portion 377a, the first and second central portions 377b and 377c, and the upper portion 377d having the first, second, third and fourth thicknesses, respectively, and the fourth filling layer pattern 386 may include a lower portion and a second central portion of relatively small thicknesses and a first central portion and an upper portion of relatively large thicknesses.

Figure 37:
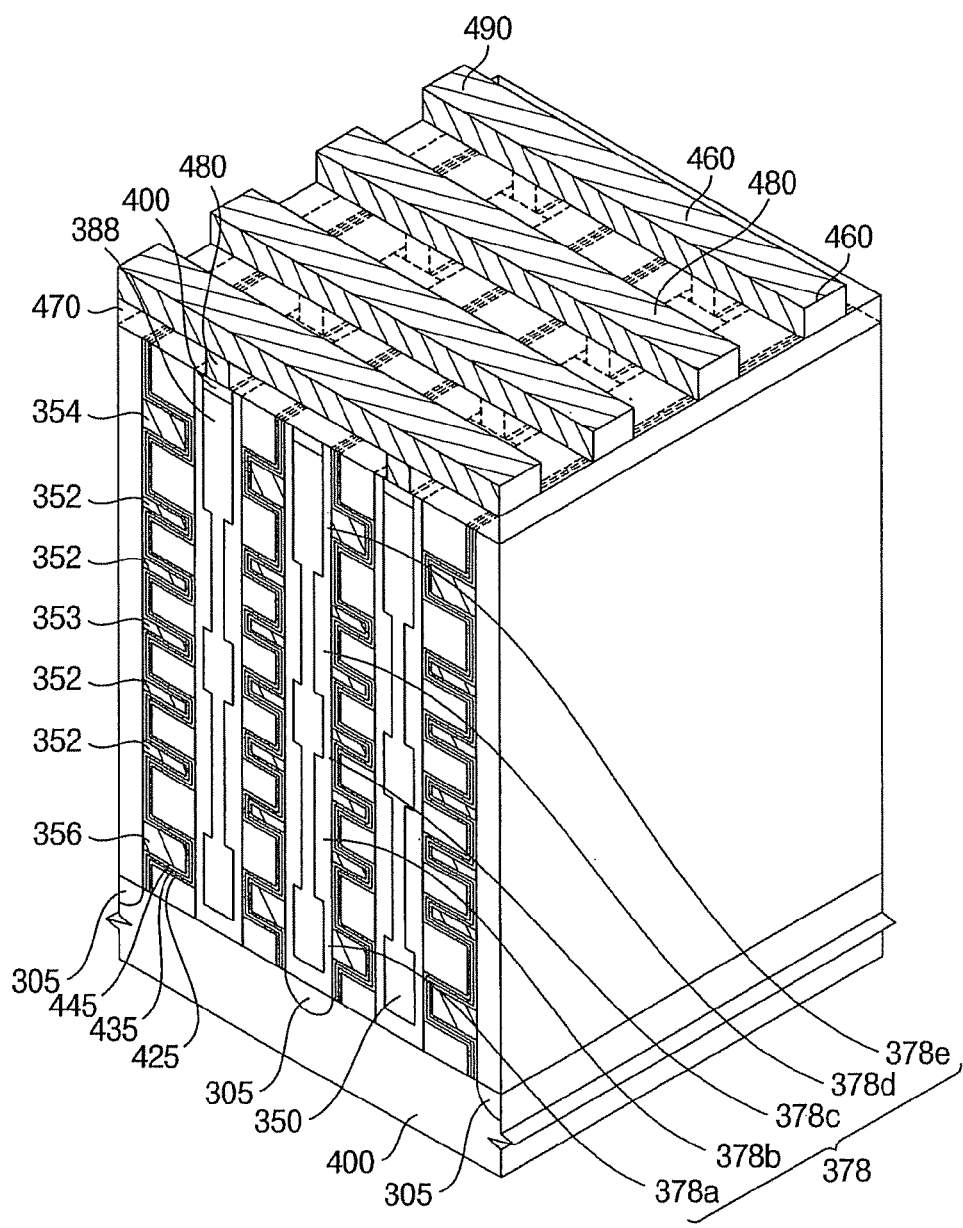
Figure 37:
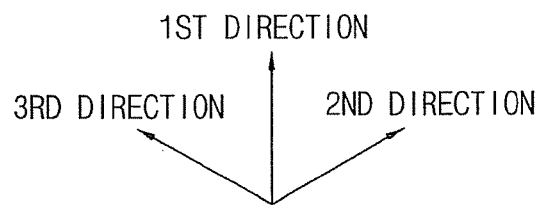

FIG. 37 is a perspective diagram illustrating vertical memory devices in accordance with yet further example embodiments. The vertical memory device of FIG. 37 may be substantially the same as or similar to that of FIG. 36, except for the shapes of a channel and a filling layer pattern, and thus repetitive explanations may be omitted herein.

Referring to FIG. 37, a channel 378 may be of a linear and/or bar shape, and may include a lower portion 378a of a first thickness, a first central portion 378b of a second thickness greater than the first thickness, a second central portion 378c of a third thickness less than the second thickness, a third central portion 378d of a fourth thickness greater than the third thickness, and an upper portion 378e of a fifth thickness less than the fourth thickness. The lower portion 378a of the channel 378 may be formed adjacent to a GSL 356, the second portion 378c of the channel 378 may be formed adjacent to a dummy word line 353, and the upper portion 378e of the channel 378 may be formed adjacent to an SSL 354.

A fifth filling layer pattern 388 may be formed in a space between channels 378 of a linear shape adjacent to each other in a third direction substantially parallel to a top surface of a substrate 300. The channel 378 may include the lower portion 378a, the first, second and third central portions 378b, 378c and 378d, and the upper portion 378e of the first, second, third, fourth and fifth thicknesses, respectively, and the fifth filling layer pattern 388 may include a lower portion, a second central portion and an upper portion of relatively large thicknesses and a first portion and a third central portion of relatively small thicknesses.

Figure 38:
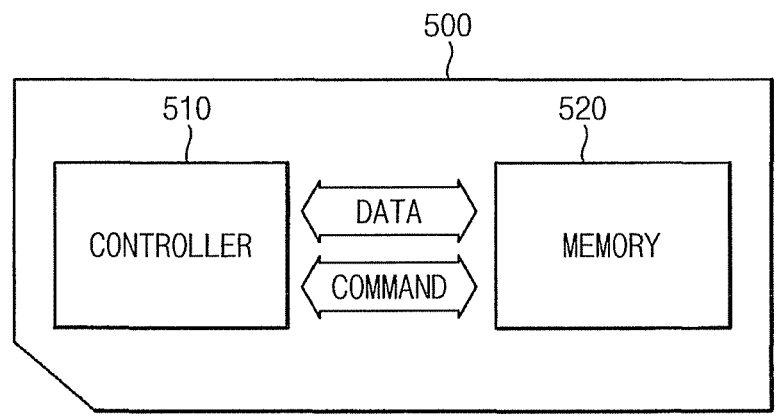

FIG. 38 is a schematic diagram illustrating a memory card 500 according to example embodiments. Referring to FIG. 38, a controller 510 and a memory 520 may exchange electric signals. For example, according to commands of the controller 510, the memory 520 and the controller 510 may exchange data. The memory card 500 may store data in the memory 520 and/or output data from the memory 520. The memory 520 may include one of the vertical memory devices described above in reference to FIGS. 1A-37. A memory card 500 may be used as a storage medium for various portable electronic devices. For example, the memory card 500 may be a multimedia card (MMC) or a secure digital (SD) card.

Figure 39:
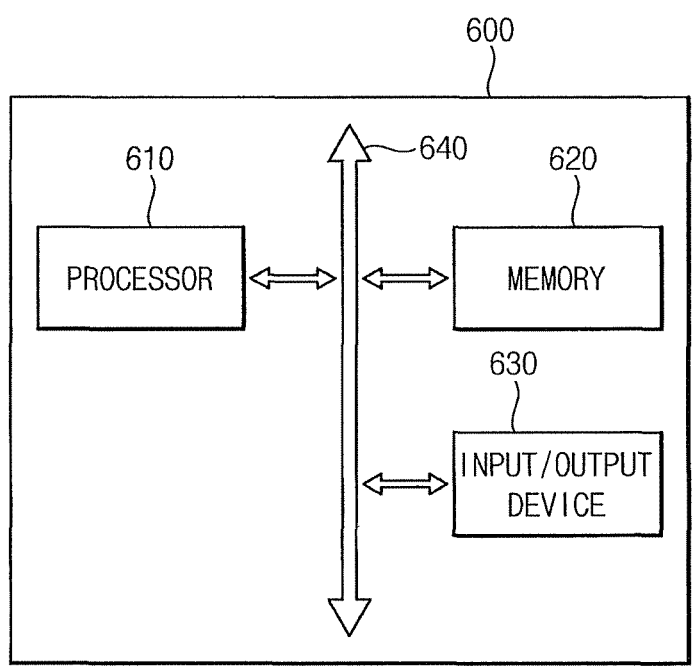

FIG. 39 is a block diagram illustrating an electronic system 600 according to example embodiments. Referring to FIG. 21, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device (e.g. a personal computer or a network) by using the input/output device 630 and may exchange data with the external device.

The memory 620 may store codes or programs for operations of the processor 610. For example, the memory 620 may include one of the vertical memory devices described above in reference to FIGS. 1A-37. For example, an electronic system 600 may embody various electronic control systems requiring the memory 620, and, for example, may be used in mobile phones, MP3 players, navigation devices, solid state disks (SSD), or household appliances.

While example embodiments have been particularly shown and described, it will be understood by one of ordinary skill in the art that variations in form and detail may be made therein without departing from the spirit and scope of the claims.

What is claimed is:

1. A vertical memory device, comprising:
a channel extending in a first direction substantially perpendicular to a top surface of a substrate, a thickness of the channel varying according to height;
at least one ground selection line (GSL), a plurality of word lines and at least one string selection line (SSL) spaced apart from each other on a sidewall of the channel in the first direction,
the at least one GSL, the plurality of word lines, and the at least one SSL defining an opening through which the channel extends in the first direction,
the opening having a width that does not vary substantially along the first direction,
the channel including an outer surface that extends in the first direction from the at least one GSL to the at least one SSL,
the outer surface of the channel having a perimeter that substantially does not vary according to height along the first direction; and
a tunnel insulation layer pattern, a charge trapping layer pattern and a blocking layer pattern sequentially stacked in a second direction substantially perpendicular to the sidewall of the channel, the tunnel insulation layer pattern, the charge trapping layer pattern and the blocking layer pattern between the sidewall of the channel and each of the GSL, the word lines, and the SSL.

2. The device of claim 1, wherein the channel includes a lower portion and an upper portion, a thickness of the lower portion greater than a thickness of the upper portion.

3. The device of claim 2, wherein a height of the lower portion is less than a height of the SSL.

4. The device of claim 1, wherein the channel includes a lower portion, a central portion and an upper portion, a thickness of the lower portion and a thickness of the upper portion each less than a thickness of the central portion.

5. The device of claim 4, wherein a height of the central portion is less than a height of the SSL and greater than a height of the GSL.

6. The device of claim 1, further comprising:
a dummy word line on the sidewall of the channel between at least two of the plurality of word lines,
wherein the channel includes a lower portion of a first thickness, a first central portion of a second thickness, a second central portion of a third thickness, and an upper portion of a fourth thickness, each of the second and fourth thicknesses being less than each of the first and third thicknesses.

7. The device of claim 6, wherein:
the first central portion is at a same height as the dummy word line, and
the upper portion is at a same height as the SSL.

8. The device of claim 1, further comprising:
a dummy word line on the sidewall of the channel between at least two of the plurality of word lines,
wherein the channel includes a lower portion of a first thickness, a first central portion of a second thickness, a second central portion of a third thickness, a third central portion of a fourth thickness, and an upper portion of a fifth thickness, each of the first, third and fifth thicknesses being less than each of the second and fourth thicknesses.

9. The device of claim 8, wherein:
the lower portion is at a same height as the GSL,
the second central portion is at a same height as the dummy word line, and
the upper portion is at a same height as the SSL.

10. The device of claim 1, wherein the channel is a plurality of cup shaped channels spaced apart in a second direction substantially parallel to the top surface of the substrate.

11. The device of claim 1, wherein the channel is a plurality of linearly shaped channels spaced apart in a second direction substantially parallel to the top surface of the substrate.

12. The device of claim 1, further comprising:
a common source line (CSL) extending in a third direction substantially perpendicular to the second direction at an upper portion of the substrate; and
a bit line extending in the second direction and electrically connected to the channel.

13. A method of manufacturing a vertical memory device, comprising:
forming at least one ground selection line (GSL), a plurality of word lines and at least one string selection line (SSL) spaced apart in a first direction on a substrate, the at least one GSL, the plurality of word lines, and the at least one SSL defining an opening having a width that does not substantially vary along the first direction;

forming a channel in the opening on the substrate, the channel having a thickness that varies according to a height, the channel extending in the first direction substantially perpendicular to the top surface of the substrate, the channel including an outer surface that extends in the first direction from the at least one GSL to the at least one SSL, the outer surface of the channel having a perimeter that substantially does not vary according to height along the first direction; and forming a tunnel insulation layer pattern, a charge trapping layer pattern, and a blocking layer pattern sequentially stacked in a second direction substantially perpendicular to the sidewall of the channel and each of the GSL, the plurality of word lines, and the SSL.

14. The method of claim 13, wherein the forming a channel includes forming a lower portion of the channel to a first thickness and forming an upper portion of the channel to a second thickness less than the first thickness, the lower portion being formed to a height less than a height of the SSL.

15. A vertical memory device, comprising:
a ground selection line (GSL);
a word line (WL) on the GSL;
a string selection line (SSL) on the WL;
a channel of varying thickness crossing the GSL, WL and SSL,
the channel having an outer surface that extends in a first direction from the GSL to the SSL,
the outer surface of the channel having a perimeter that substantially does not vary according to height along the first direction; and
a tunnel insulation layer pattern, a charge trapping layer pattern and a blocking layer pattern sequentially stacked,
the tunnel insulation layer pattern, the charge trapping layer pattern and the blocking layer pattern extending between a sidewall of the channel and each of the GSL, the plurality of word lines, and the SSL.

16. The device of claim 15, wherein a thickness of the channel is greatest adjacent to the WL.

17. The device of claim 16, further comprising:
an insulation layer at least partially surrounded by the channel and including at least two different insulating materials.

18. The device of claim 15, further comprising:
a dummy word line (DWL) on the WL, a thickness of the channel adjacent to the DWL less than a thickness of the channel adjacent to the WL,
wherein a thickness of the channel adjacent to at least one of the GSL and SSL is less than the thickness of the channel adjacent to the WL.

19. The device of claim 18, wherein:
the thickness of the channel adjacent to at least one of the GSL and the SSL is the thickness of the channel adjacent to the GSL;
the thickness of the channel adjacent to the WL is greater than a thickness of the channel adjacent to the SSL; and
the thickness of the channel adjacent to the GSL is different from a thickness of the channel adjacent to the SSL.

* * * * *